US011805695B2

(12) United States Patent
Baek et al.

(10) Patent No.: US 11,805,695 B2
(45) Date of Patent: Oct. 31, 2023

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., LTD., Yongin-si (KR)

(72) Inventors: Jang Yeol Baek, Yongin-si (KR); Jaejin Lyu, Yongin-si (KR); Sun Young Pak, Suwon-si (KR); Junha Park, Gwacheon-si (KR); Hankyu Pak, Suwon-si (KR); Mun-Ki Sim, Seoul (KR); Chanseok Oh, Seoul (KR); Hyoyoung Lee, Suwon-si (KR); Minjung Jung, Gangwon-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 541 days.

(21) Appl. No.: 17/022,839

(22) Filed: Sep. 16, 2020

(65) Prior Publication Data

US 2021/0242404 A1 Aug. 5, 2021

(30) Foreign Application Priority Data

Feb. 4, 2020 (KR) ........................ 10-2020-0012993

(51) Int. Cl.
*H01L 51/00* (2006.01)
*H10K 85/30* (2023.01)
(Continued)

(52) U.S. Cl.
CPC ............ *H10K 85/322* (2023.02); *C07F 5/05* (2013.01); *C09K 11/02* (2013.01); *C09K 11/06* (2013.01);
(Continued)

(58) Field of Classification Search
CPC ................................ C07F 5/05; H10K 85/322
See application file for complete search history.

(56) References Cited

U.S. PATENT DOCUMENTS

| | | | | |
|---|---|---|---|---|
| 7,157,155 B2 | 1/2007 | Che et al. | | |
| 2005/0153164 A1* | 7/2005 | Che | C09K 11/06 | 428/917 |

(Continued)

FOREIGN PATENT DOCUMENTS

| | | |
|---|---|---|
| JP | 2016-210728 | 12/2016 |
| KR | 10-2011-0095891 | 8/2011 |
| WO | 2012/126832 | 9/2012 |

OTHER PUBLICATIONS

Muller et al "Is There B—N Bond-Length Alternation in 1,2:3,4:5,6-Tris(biphenylylene)borazines?", ChemPlusChem vol. 78, pp. 988-994, May 17, 2013.*

*Primary Examiner* — Alexander C Kollias

(74) *Attorney, Agent, or Firm* — KILE PARK REED & HOUTTEMAN PLLC

(57) ABSTRACT

An organic electroluminescence device of an embodiment includes a first electrode, a second electrode, and an emission layer disposed between the first electrode and the second electrode, wherein the emission layer includes a polycyclic compound represented by Formula 1, and long-life device characteristics may be shown.

[Formula 1]

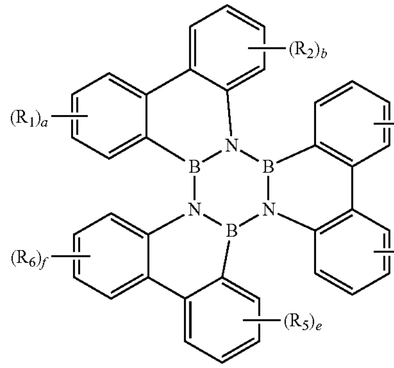

20 Claims, 2 Drawing Sheets

(51) Int. Cl.

| | |
|---|---|
| ***C09K 11/06*** | (2006.01) |
| ***C09K 11/02*** | (2006.01) |
| ***C07F 5/05*** | (2006.01) |
| ***H10K 85/60*** | (2023.01) |
| *H10K 50/11* | (2023.01) |
| *H10K 50/844* | (2023.01) |
| *H10K 101/10* | (2023.01) |

(52) U.S. Cl.
CPC ....... *H10K 85/657* (2023.02); *H10K 85/6572* (2023.02); *C09K 2211/1007* (2013.01); *C09K 2211/1014* (2013.01); *C09K 2211/1018* (2013.01); *C09K 2211/1022* (2013.01); *H10K 50/11* (2023.02); *H10K 50/844* (2023.02); *H10K 2101/10* (2023.02)

(56) References Cited

U.S. PATENT DOCUMENTS

| | | | |
|---|---|---|---|
| 2011/0253991 A1 | 10/2011 | Oyamada et al. | |
| 2014/0088324 A1 | 3/2014 | Bonifazi et al. | |
| 2018/0226580 A1* | 8/2018 | Fitzgerald | C07F 5/05 |
| 2018/0351102 A1* | 12/2018 | Wolohan | H10K 85/6574 |
| 2019/0051829 A1* | 2/2019 | Wolohan | H10K 85/656 |

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION(S)

This application claims priority to and benefits of Korean Patent Application No. 10-2020-0012993 under 35 U.S.C. § 119, filed on Feb. 4, 2020 in the Korean Intellectual Property Office, the entire contents of which are incorporated herein by reference.

BACKGROUND

1. Technical Field

The disclosure herein relates to an organic electroluminescence device and a polycyclic compound used therein.

2. Description of the Related Art

Recently, the development of an organic electroluminescence display device as an image display device is being actively conducted. Different from a liquid crystal display device, the organic electroluminescence display device is so-called a self-luminescent display device in which holes and electrons injected from a first electrode and a second electrode recombine in an emission layer, and a light-emitting material including an organic compound in the emission layer emits light to attain display.

In the application of an organic electroluminescence device to a display device, the increase of the emission efficiency and the life of the organic electroluminescence device is required, and development on materials for an organic electroluminescence device stably attaining the requirement is being continuously required.

In order to provide an organic electroluminescence device with high efficiency, techniques on phosphorescence emission which uses energy in a triplet state or delayed fluorescence emission which uses the generating phenomenon of singlet excitons by the collision of triplet excitons (triplet-triplet annihilation, TTA) are being developed, and development on a material for thermally activated delayed fluorescence (TADF) using delayed fluorescence phenomenon is being conducted.

SUMMARY

The disclosure provides an organic electroluminescence device showing excellent emission efficiency.

The disclosure also provides a polycyclic compound for an organic electroluminescence device having high efficiency and long-life characteristics.

An embodiment of the inventive concept provides a polycyclic compound represented by Formula 1:

[Formula 1]

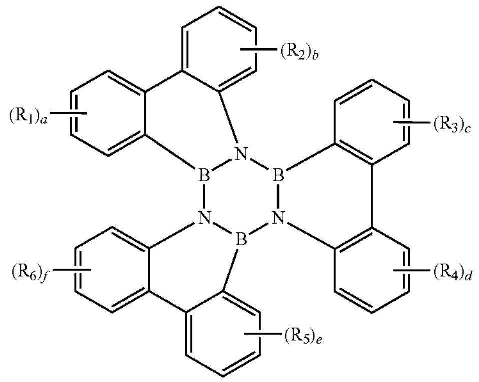

In Formula 1, a to f are each independently an integer from 0 to 4, and $R_1$ to $R_6$ are each independently a hydrogen atom, a deuterium atom, a halogen atom, a cyano group, a substituted or unsubstituted amino group, a substituted or unsubstituted silyl group, a substituted or unsubstituted alkyl group of 1 to 10 carbon atoms, a substituted or unsubstituted aryl group of 6 to 60 carbon atoms, or a substituted or unsubstituted heterocyclic group of 2 to 60 carbon atoms.

In an embodiment, $R_1$ to $R_6$ may be each independently represented by one of groups AR-1 to AR-5:

AR-1

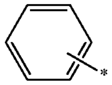

AR-2

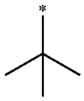

AR-3

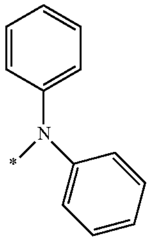

AR-4

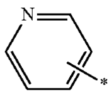

AR-5

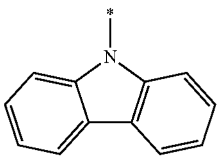

For groups AR-1 to AR-5, * indicates a binding site to a neighboring atom.

In an embodiment, one of a and b may be 1, one of c and d may be 1, one of e and f may be 1, and the remainder may be 0.

In an embodiment, if a, c, and e are each 1, and if b, d, and f are each 0, then $R_1$, $R_3$ and $R_5$ may be the same.

In an embodiment, if a, c, and e are each 0, and if b, d, and f are each 1, then $R_2$, $R_4$ and $R_6$ may be the same.

In an embodiment, a to f may each be 1, and $R_1$ to $R_6$ may each be a phenyl group.

In an embodiment, the polycyclic compound represented by Formula 1 may be a material emitting thermally activated delayed fluorescence.

In an embodiment, the polycyclic compound represented by Formula 1 may be a blue dopant.

In an embodiment of the inventive concept, there is provided an organic electroluminescence device including a first electrode; a second electrode disposed on the first electrode; and an emission layer disposed between the first electrode and the second electrode, wherein the first electrode and the second electrode each independently comprise at least one selected from the group consisting of Ag, Mg, Cu, Al, Pt, Pd, Au, Ni, Nd, Ir, Cr, Li, Ca, LiF/Ca, LiF/Al, Mo, Ti, In, Sn, Zn, an oxide thereof, a compound thereof, and a mixture thereof. The emission layer may include the polycyclic compound of an embodiment.

In an embodiment, the emission layer may emit delayed fluorescence.

In an embodiment, the emission layer may include a host and a dopant, and the dopant may include the polycyclic compound.

In an embodiment, the emission layer may include a host and a dopant, and the host may include the polycyclic compound.

In an embodiment, the emission layer may emit light having a central wavelength in a range of about 430 nm to about 470 nm.

In an embodiment, a capping layer may be further included on the second electrode, and the capping layer may include the polycyclic compound.

BRIEF DESCRIPTION OF THE DRAWINGS

The accompanying drawings are included to provide a further understanding of the inventive concept and are incorporated in and constitute a part of this specification. The drawings illustrate embodiments of the inventive concept and, together with the description, serve to explain principles of the inventive concept. In the drawings.

DETAILED DESCRIPTION OF THE EMBODIMENTS

Figure 1:
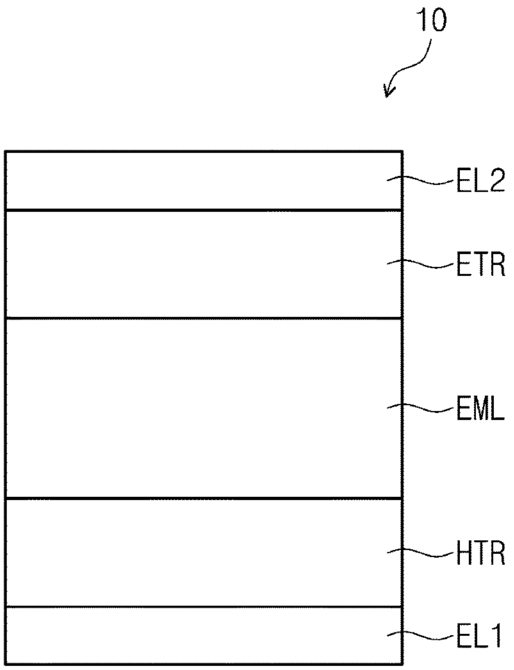
FIG. 1 is a schematic cross-sectional view illustrating an organic electroluminescence device according to an embodiment of the inventive concept.

The inventive concept may have various modifications and may be embodied in different forms, and example embodiments will be explained in detail with reference to the accompany drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

It will be understood that when an element (or region, layer, part, etc.) is referred to as being "on", "connected to" or "coupled to" another element, it can be directly on, connected, or coupled to the other element or intervening elements may be present.

Like reference numerals refer to like elements throughout. In the drawings, the thickness, the ratio, and the dimensions of constituent elements may be exaggerated for effective explanation of their technical contents.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or". Throughout the disclosure, the expression "at least one of A, B, and C" may indicate only A, only B, only C, both A and B, both A and C, both B and C, all of A, B, and C, or variations thereof.

The term "at least one of" is intended to include the meaning of "at least one selected from the group consisting of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the invention. Similarly, a second element could be termed a first element. As used herein, the singular forms are intended to include the plural forms as well, unless the context clearly indicates otherwise.

The terms "below", "beneath", "on" and "above" are used for explaining the relation of elements shown in the drawings. The terms are relative concept and are explained based on the direction shown in the drawing.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises," "comprising," "includes," "including," "contains," and/or "containing" when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, the organic electroluminescence device according to an embodiment of the inventive concept will be explained with reference to attached drawings.

FIGS. 1 to 4 are schematic cross-sectional views showing organic electroluminescence devices according to embodiments of the inventive concept.

Referring to FIGS. 1 to 4, in an organic electroluminescence device 10 according to an embodiment, a first electrode EL1 and a second electrode EL2 are oppositely disposed, and between the first electrode EL1 and the second electrode EL2, an emission layer EML may be disposed.

The organic electroluminescence device 10 of an embodiment further includes functional groups between the first electrode EL1 and the second electrode EL2 in addition to the emission layer EML. The functional groups may include a hole transport region HTR and an electron transport region ETR. The organic electroluminescence device 10 of an embodiment may include a first electrode ELL a hole transport region HTR, an emission layer EML, an electron transport region ETR, and a second electrode, laminated one by one. The organic electroluminescence device 10 of an embodiment may include a capping layer CPL disposed on the second electrode EL2.

The organic electroluminescence device 10 of an embodiment may include a compound of an embodiment, which will be explained later, in the emission layer EML disposed between the first electrode EL1 and the second electrode EL2. However, an embodiment of the inventive concept is not limited thereto, but a compound of an embodiment, which will be explained later, may be included in a capping layer CPL disposed on the second electrode EL2.

Figure 2:
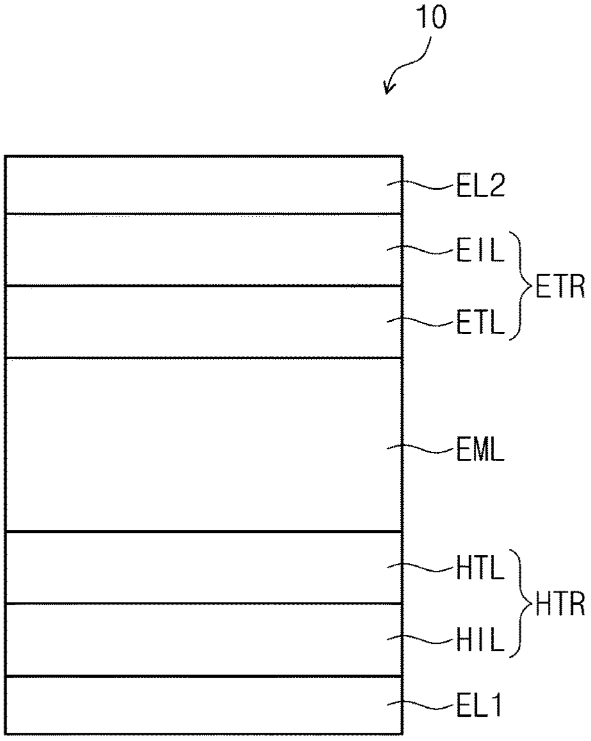
FIG. 2 is a schematic cross-sectional view illustrating an organic electroluminescence device according to an embodiment of the inventive concept.
Figure 3:
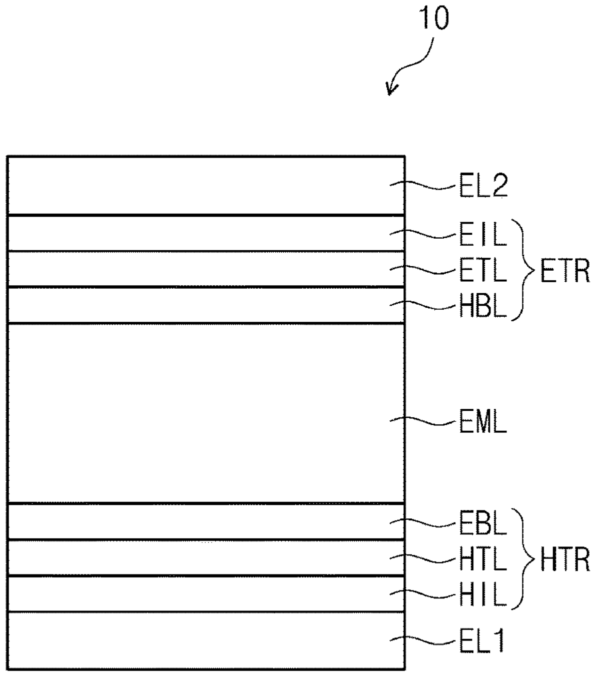
FIG. 3 is a schematic cross-sectional view illustrating an organic electroluminescence device according to an embodiment of the inventive concept.
Figure 4:
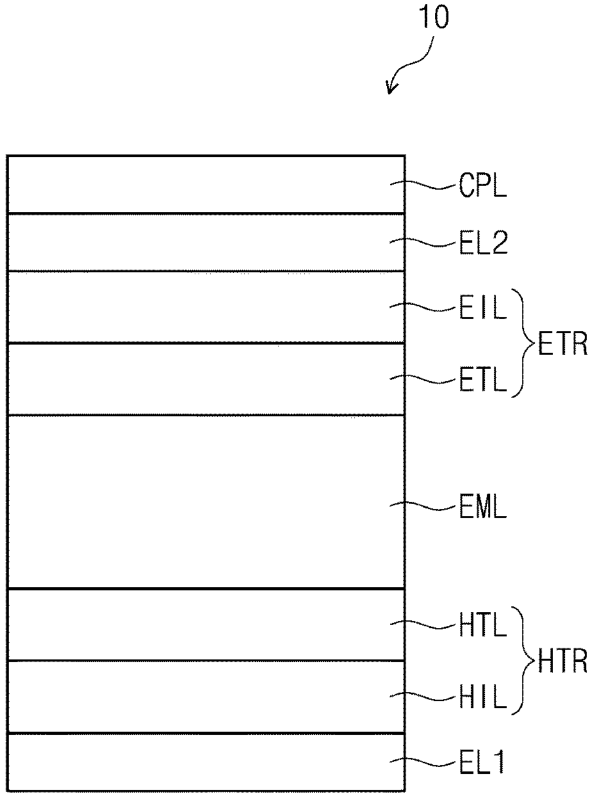
FIG. 4 is a schematic cross-sectional view illustrating an organic electroluminescence device according to an embodiment of the inventive concept.

In comparison with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. When compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 2, FIG. 4 shows the cross-sectional view of an organic electroluminescence device 10 of an embodiment including a capping layer CPL disposed on the second electrode EL2.

The first electrode EL1 has conductivity. The first electrode EL1 may be formed using a metal alloy or a conductive compound. The first electrode EL1 may be an anode. The first electrode EL1 may be a pixel electrode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The first electrode EL1 may have a structure including multiple layers including a reflective layer or a transflective layer formed using the above materials, and a transmissive conductive layer formed using ITO, IZO, ZnO, or ITZO. For example, the first electrode EL1 may include a three-layer structure of ITO/Ag/ITO. However, an embodiment of the inventive concept is not limited thereto. The thickness of the first electrode EL1 may be in a range of about 1,000 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a hole buffer layer (not shown), and an electron blocking layer EBL. The thickness of the hole transport region HTR may be in a range of about 50 Å to about 1,500 Å.

The hole transport region HTR may have a single layer formed using a single material, a single layer formed using different materials, or a multilayer structure including multiple layers formed using different materials.

For example, the hole transport region HTR may have the structure of a single layer of a hole injection layer HIL, or a hole transport layer HTL, and may have a structure of a single layer formed using a hole injection material and a hole transport material. The hole transport region HTR may have a structure of a single layer formed using different materials, or a structure laminated from the first electrode EL1 of hole injection layer HIL/hole transport layer HTL, hole injection layer HIL/hole transport layer HTL/hole buffer layer (not shown), hole injection layer HIL/hole buffer layer (not shown), hole transport layer HTL/hole buffer layer (not shown), or hole injection layer HIL/hole transport layer HTL/electron blocking layer EBL, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine, N,N'-diphenyl-N,N'-bis-[4-(phenyl-m-tolyl-amino)-phenyl]-phenyl-4,4'-diamine (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and dipyrazino[2,3-f:2',3'-h]quinoxaline-2,3,6,7,10,11-hexacarbonitrile (HAT-CN).

The hole transport layer HTL may include, for example, carbazole derivatives such as N-phenyl carbazole and polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be in a range of about 50 Å to about 10,000 Å. For example, the thickness of the hole transport region HTR may be in a range of about 100 Å to about 5,000 Å. The thickness of the hole injection region HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ) and 2,3,5,6-tetrafluoro-7,7',8,8'-tetracyanoquinodimethane (F4-TCNQ), metal oxides such as tungsten oxide, and molybdenum oxide, without limitation.

As described above, the hole transport region HTR may further include at least one of a hole buffer layer (now shown) and an electron blocking layer EBL, in addition to the hole injection layer HIL and the hole transport layer HTL. The hole buffer layer (not shown) may compensate an optical resonance distance according to the wavelength of light emitted from an emission layer EML and may increase light emission efficiency. Materials which may be included in a hole transport region HTR may be used as materials included in a hole buffer layer (not shown). The electron blocking layer EBL is a layer which may prevent electron injection from the electron transport region ETR to the hole transport region HTR.

The emission layer EML is provided on the hole transport region HTR. The emission layer EML may have a thickness in a range of about 100 Å to about 1,000 Å. For example, the emission layer EML may have a thickness in a range of about 100 Å to about 300 Å. The emission layer EML may have a single layer formed using a single material, a single layer formed using different materials, or a multilayer structure having multiple layers formed using different materials.

In the organic electroluminescence device 10 of an embodiment, the emission layer EML may include the polycyclic compound of an embodiment.

In the description, the term “substituted or unsubstituted” corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents may be substituted or unsubstituted. For example, a biphenyl group may be interpreted as an aryl group or a phenyl group substituted with a phenyl group.

In the description, examples of the halogen atom may include a fluorine atom, a chlorine atom, a bromine atom, or an iodine atom.

In the description, the alkyl may be a linear, branched, or cyclic type. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the aryl group means an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the description, the heterocyclic group means an optional functional group or substituent derived from a ring including one or more among B, O, N, P, Si and S as heteroatoms. The heterocyclic group includes an aliphatic heterocyclic group and an aromatic heterocyclic group. The aromatic heterocyclic group may be a heteroaryl group. The aliphatic heterocycle and the aromatic heterocycle may be a monocycle or a polycycle. The carbon number for forming a ring of the heterocyclic group may be 2 to 60, 2 to 30, or 2 to 20. Examples of the heterocyclic group may include an oxirane group, a thiirane group, a pyrrolidine group, a piperidine group, a tetrahydrofuran group, a tetrahydrothiophene group, a thiiane group, a tetrahydropyran group, a 1,4-dioxane group, etc., without limitation. Meanwhile, examples of the aromatic heterocyclic group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc., without limitation.

In the description, the silyl group includes an alkyl silyl group and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the carbon number of the amino group is not specifically limited, but may be 1 to 30. The amino group may include an alkyl amino group, an aryl amino group, or a heteroaryl amino group. Examples of the amino group include a methylamino group, a dimethylamino group, a phenylamino group, a diphenylamino group, a naphthylamino group, a 9-methyl-anthracenylamino group, a triphenylamino group, etc., without limitation.

In the description, "-*" means a connected position.

In the description, * indicates a binding site to a neighboring atom.

The polycyclic compound of an embodiment, included in the organic electroluminescence device 10 of an embodiment may be represented by the following Formula 1:

[Formula 1]

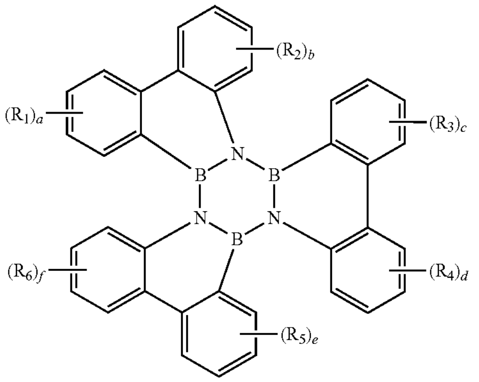

In Formula 1, a to f may be each independently an integer from 0 to 4. If any of a to f are integers of 2 or more, each of corresponding groups $R_1$ to $R_6$ may be the same or different from each other.

In Formula 1, $R_1$ to $R_6$ may be each independently a hydrogen atom, a deuterium atom, a halogen atom, a cyano group, a substituted or unsubstituted amino group, a substituted or unsubstituted silyl group, a substituted or unsubstituted alkyl group of 1 to 10 carbon atoms, a substituted or unsubstituted aryl group of 6 to 60 carbon atoms, or a substituted or unsubstituted heterocyclic group of 2 to 60 carbon atoms.

The polycyclic compound of an embodiment may have a structure including a six-member ring including boron (B) and nitrogen (N) wherein all hydrogen in the six-member ring are substituted with aryl groups. Two adjacent aryl groups among six substituted aryl groups may be connected with each other. In the polycyclic compound of an embodiment, for a boron (B) atom and an adjacent nitrogen (N) atom, two aryl groups bonded to the neighboring B and N among the atoms forming the six-member ring may be combined with each other to form a ring. The polycyclic compound of an embodiment may have a condensed structure of four rings, each of which is formed from one B atom, one N atom and two aryl groups substituted thereto.

The polycyclic compound of an embodiment may be used as a light-emitting material emitting blue light in a wavelength region of about 470 nm or less. For example, the polycyclic compound of an embodiment, represented by Formula 1 may be a light-emitting material having a light-emitting central wavelength in a wavelength region in a range of about 430 nm to about 470 nm.

According to an embodiment, $R_1$ to $R_6$ in Formula 1 may be each independently represented by one of groups AR-1 to AR-5:

AR-1

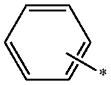

AR-2

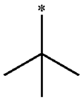

AR-3

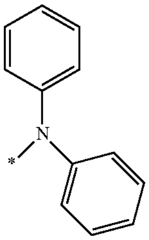

AR-4

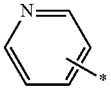

AR-5

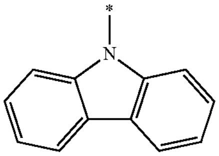

In Formula 1, if a to f are each 1, then $R_1$ to $R_6$ may be the same, or at least one thereof may be different. For example, if a to f are each 1, then $R_1$ to $R_6$ may each be AR-1.

In the polycyclic compound of an embodiment, represented by Formula 1, one of a and b may be 1, one of c and d may be 1, one of e and f may be 1, and the remainder may be 0. For example, a, c, and e may each be 1, and b, d, and f may each be 0. For example, a, c, and e may each be 0, and b, d, and f may each be 1. If a, c, and e are each 1, and if b, d, and f are each 0, then $R_1$, $R_3$, and $R_5$ may be the same or different from each other. For example, $R_1$, $R_3$, and $R_5$ may each be AR-1. In an embodiment, $R_1$, $R_3$, and $R_5$ may each be AR-3. If a, c, and e are each 0, and if b, d, and f are each 1, then $R_2$, $R_4$, and $R_6$ may be the same or different from each other. For example, $R_2$, $R_4$, and $R_6$ may each be AR-1. In an embodiment, $R_2$, $R_4$, and $R_6$ may each be AR-2. However, an embodiment of the inventive concept is not limited thereto.

In the polycyclic compound of an embodiment, aryl groups may be combined with all ring-forming atoms of a borazine group which includes three B atoms and three N atoms. Two among six aryl groups which are connected with B and N may be combined in pairs. The polycyclic compound of an embodiment may form condensed ring structures from two connected aryl groups, B and N, and through the condensed ring structure, multi-resonance may become possible.

The polycyclic compound of an embodiment may be any one among the compounds represented in Compound Group 1, which includes Compounds 1 to 32. The organic electroluminescence device 10 of an embodiment may include at least one polycyclic compound represented by Compound Group 1 in an emission layer EML.

[Compound Group 1]
1
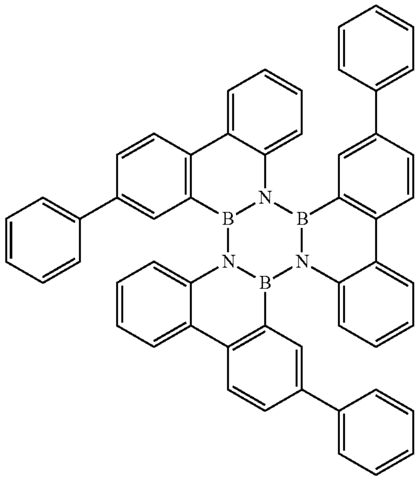
2
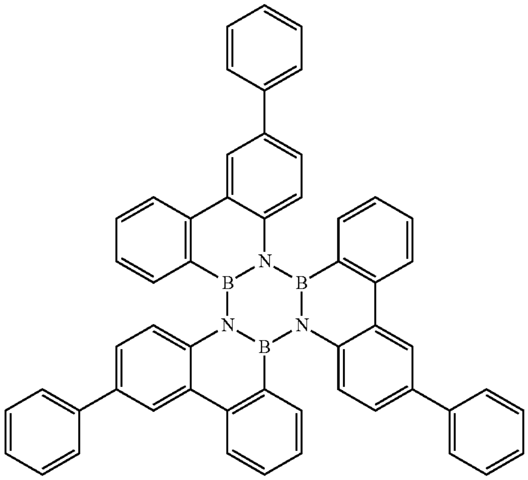
3
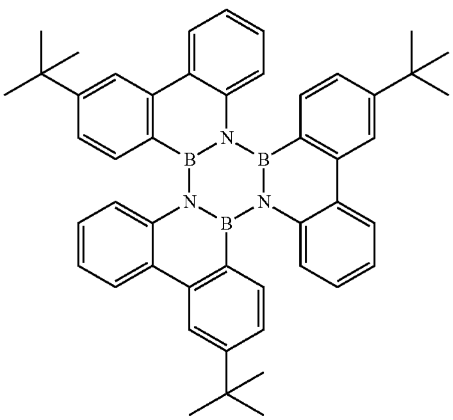
-continued
4
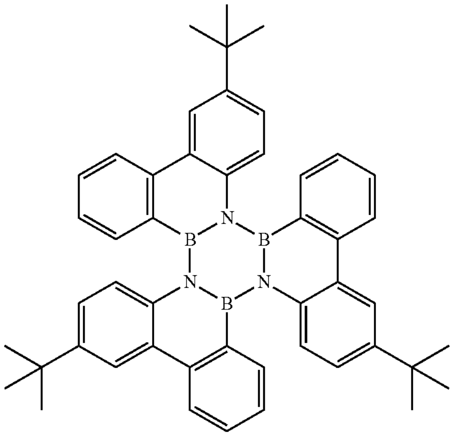
5
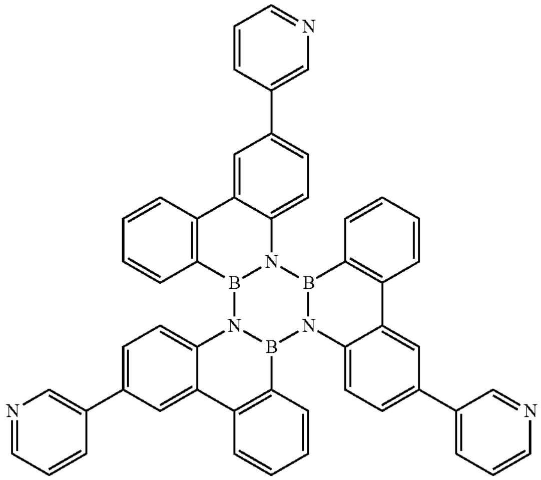
6
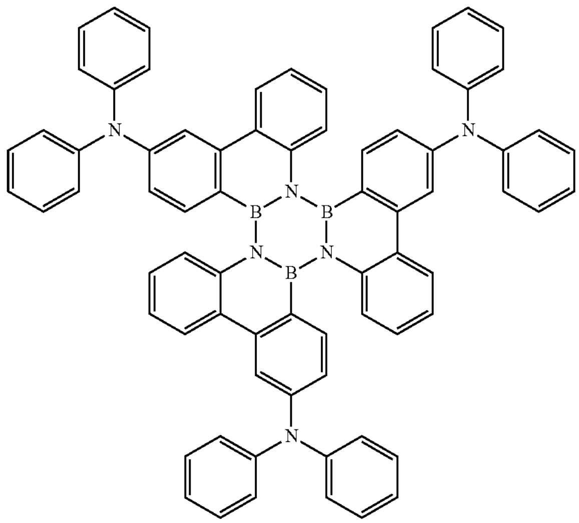

-continued
7
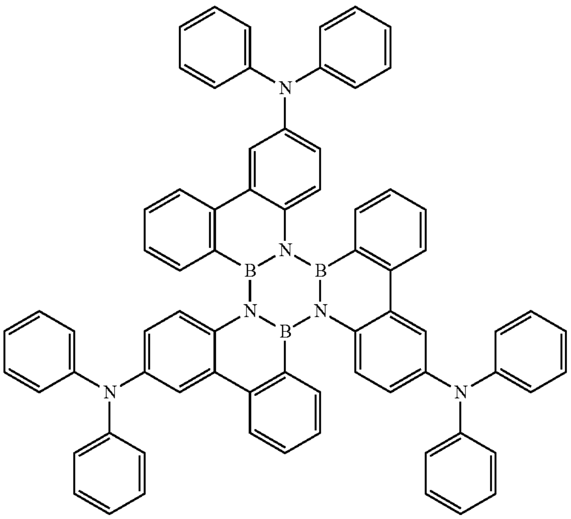
8
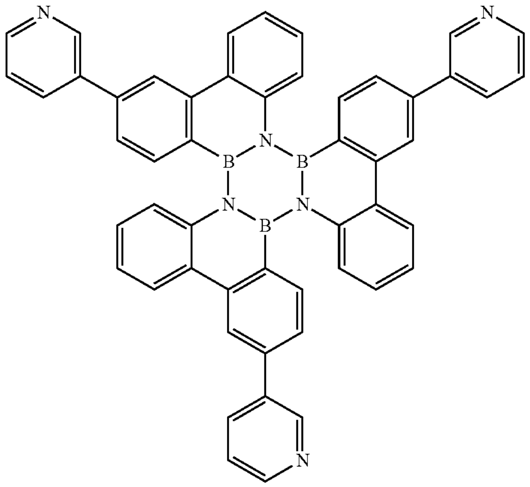
9
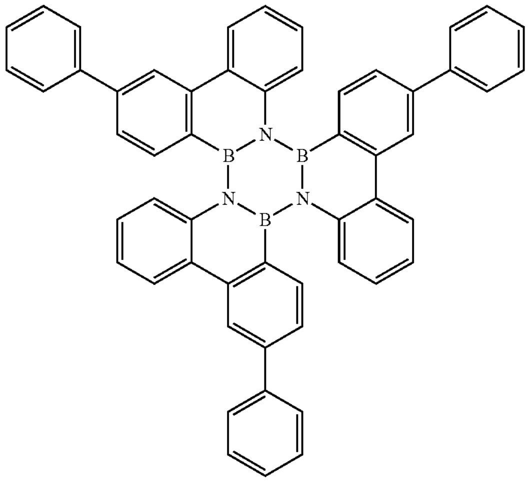
-continued
10
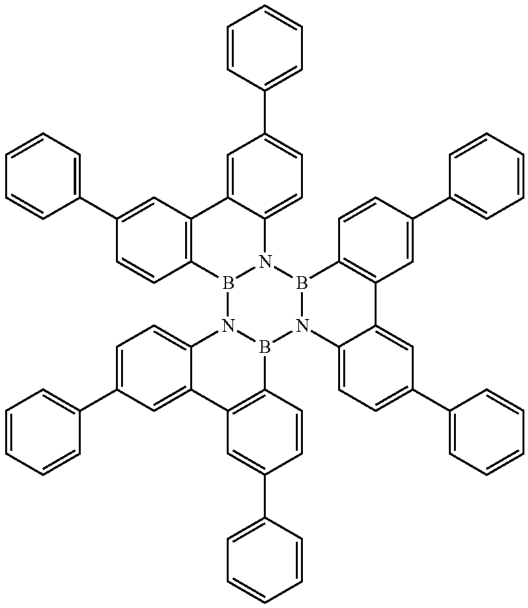
11
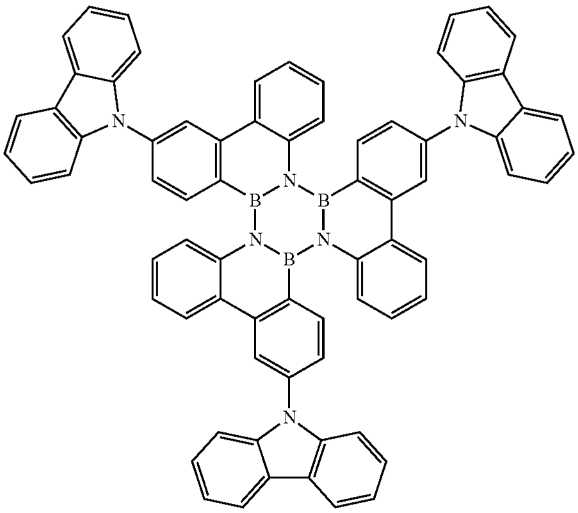
12
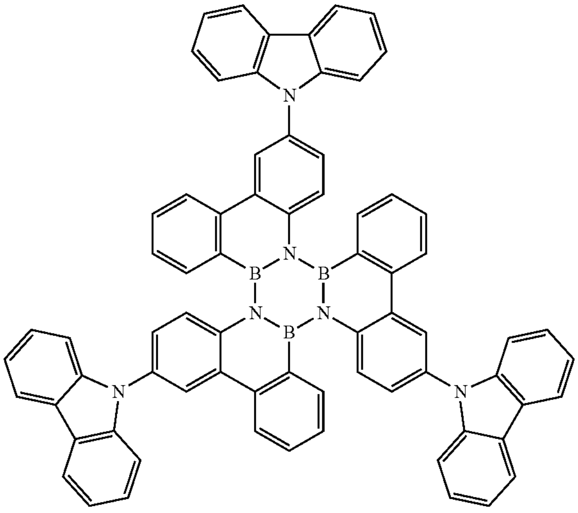

13
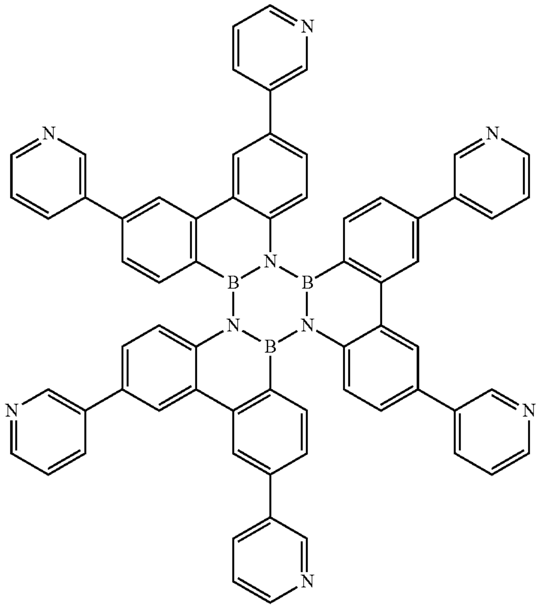
14
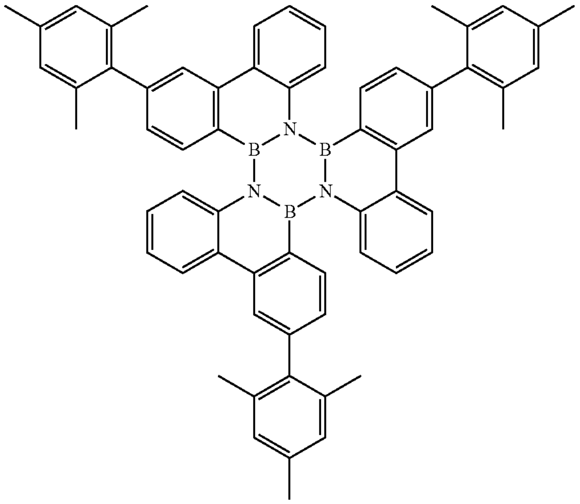
15
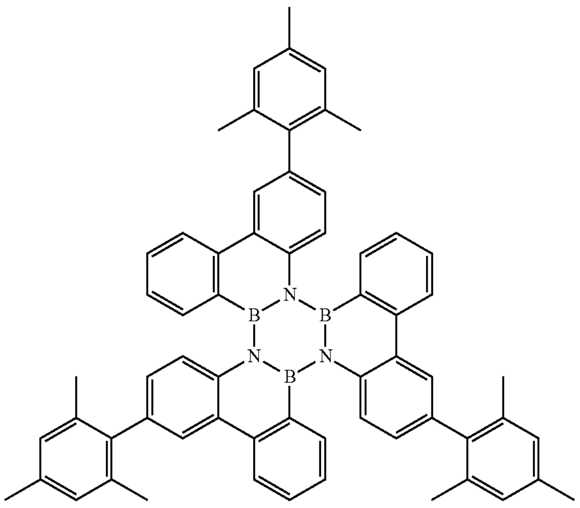
16
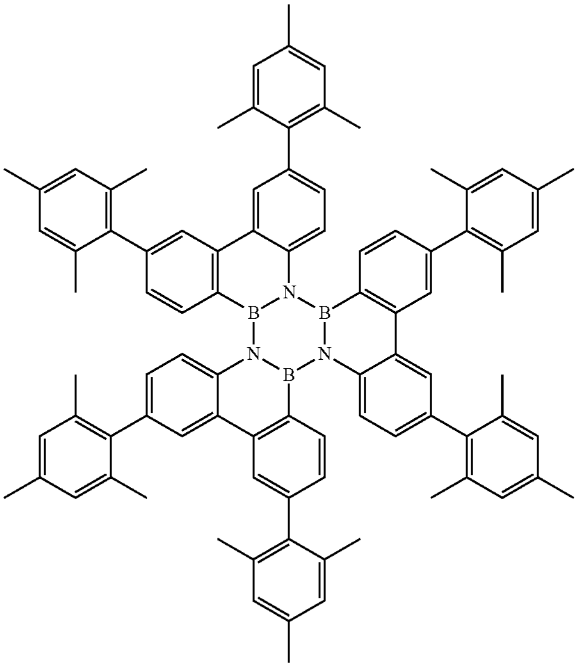
17
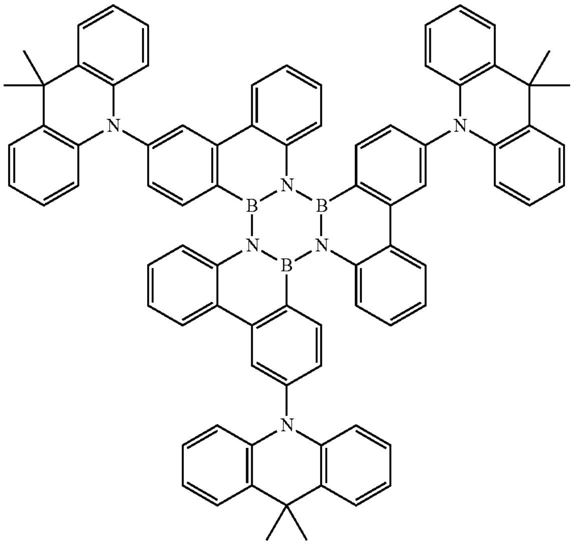

-continued
18
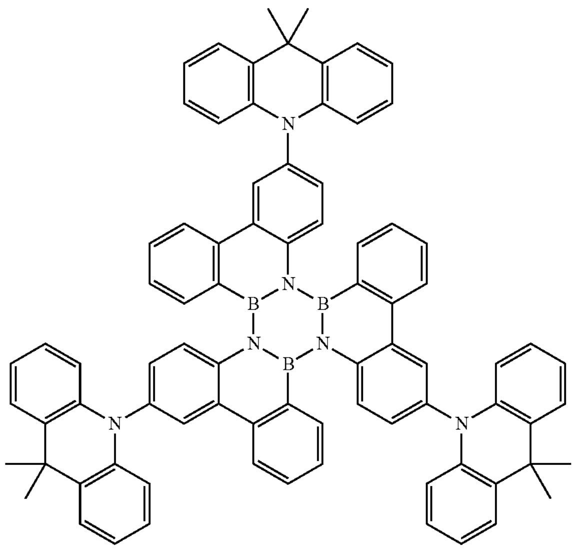
19
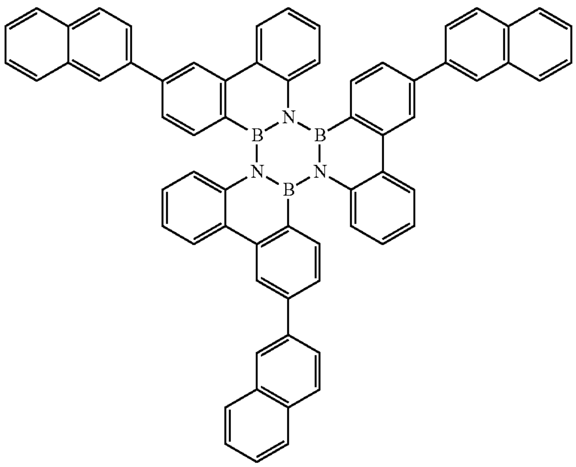
20
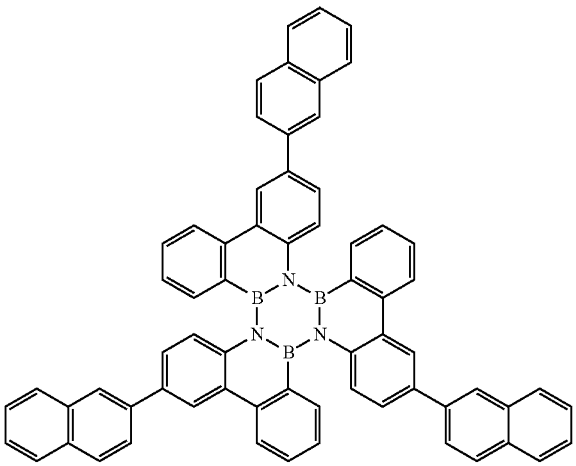
-continued
21
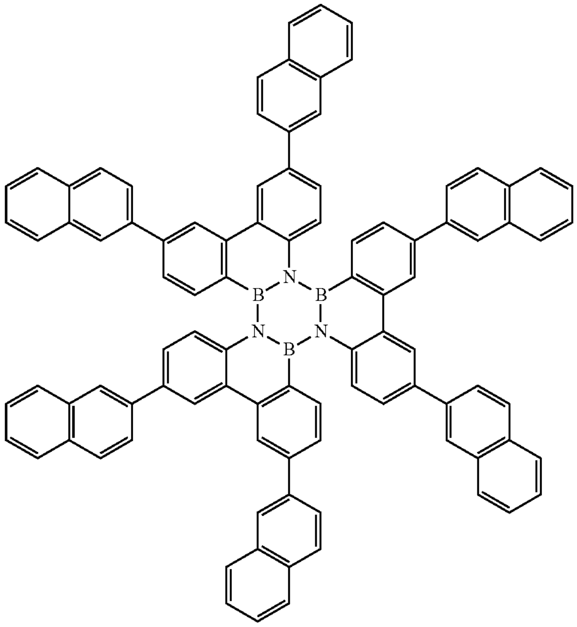
22
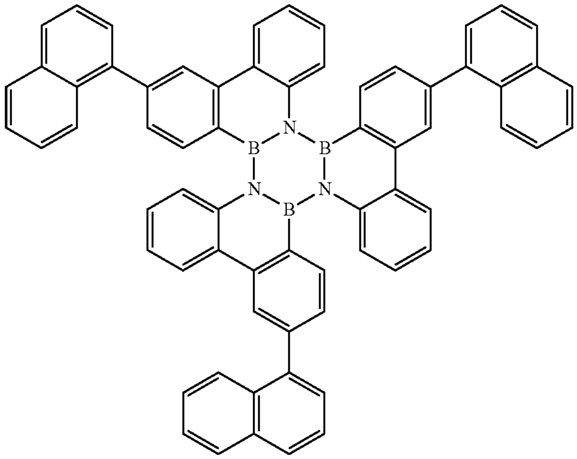
23
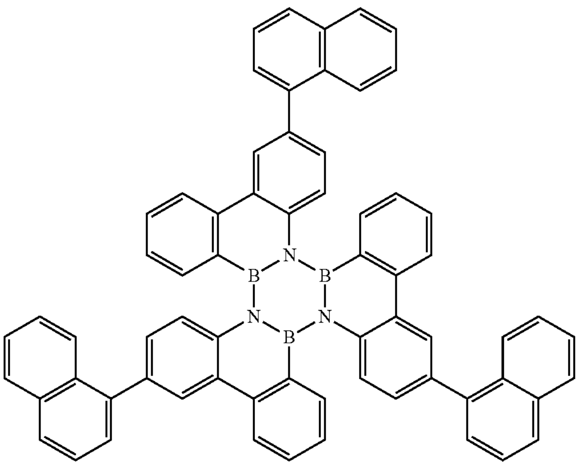

-continued
24
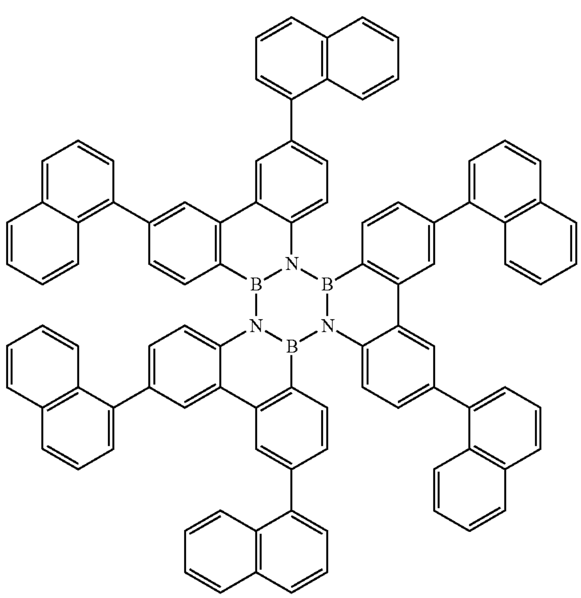
25
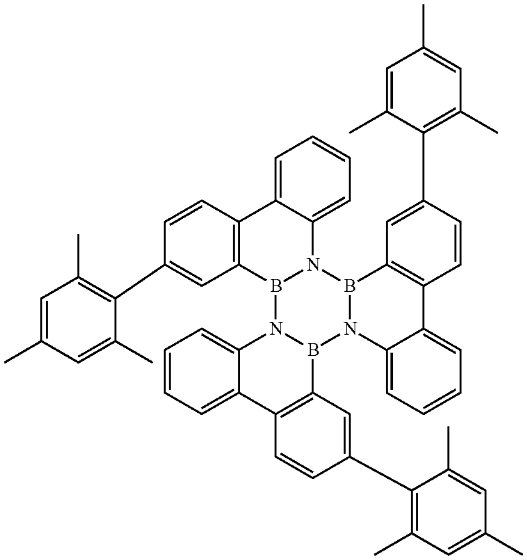
-continued
26
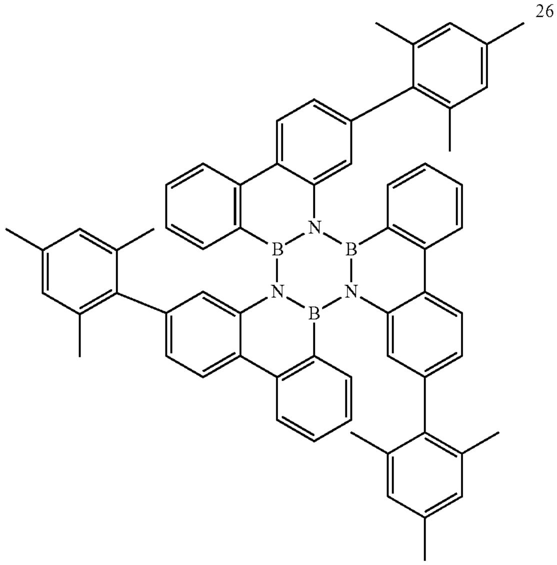
27
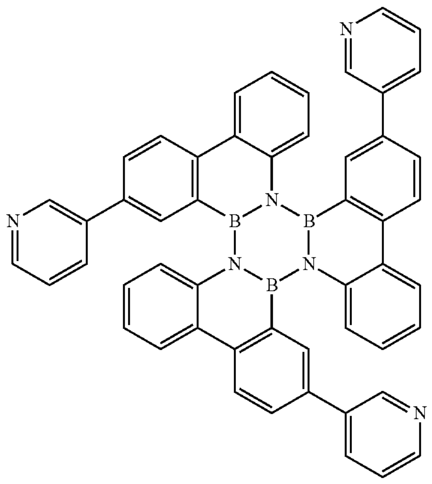
28
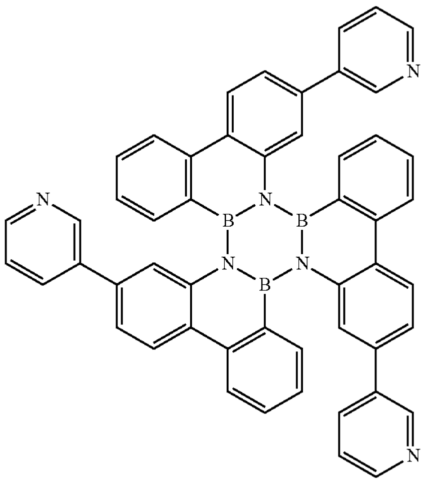

-continued

29

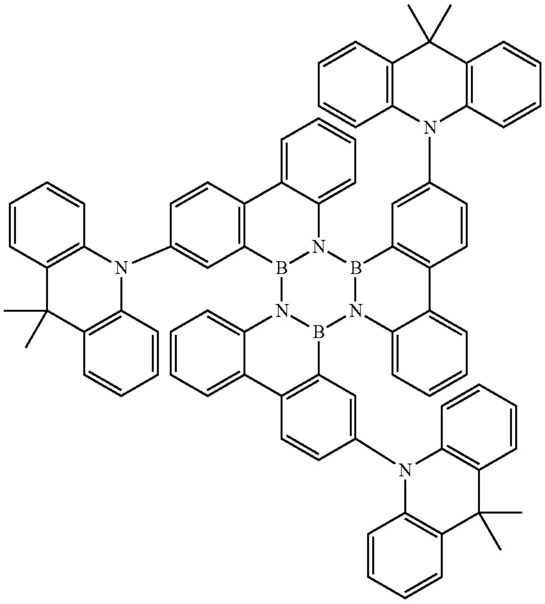

30

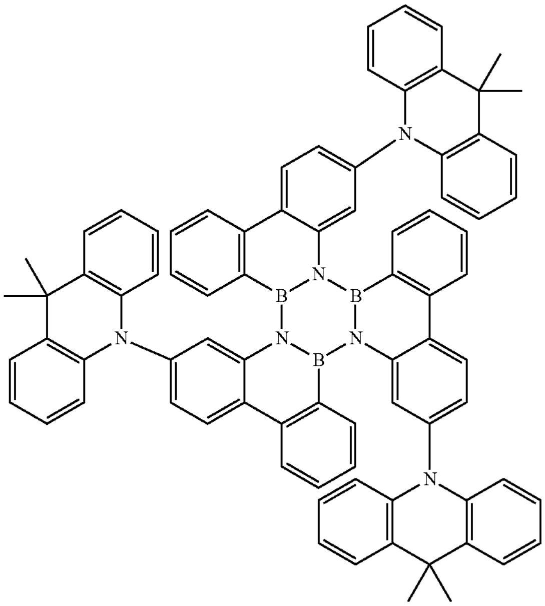

-continued

31

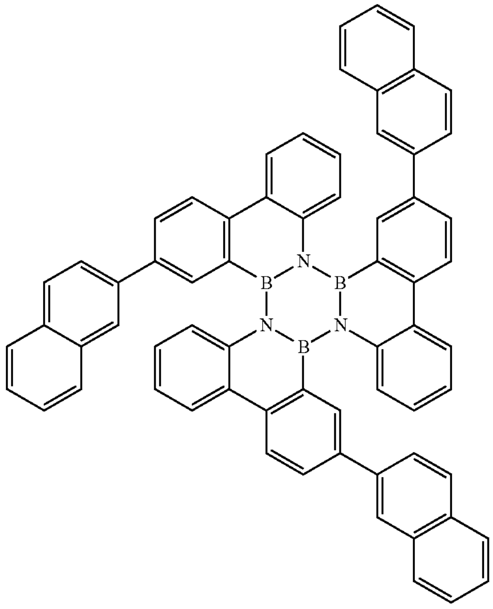

32

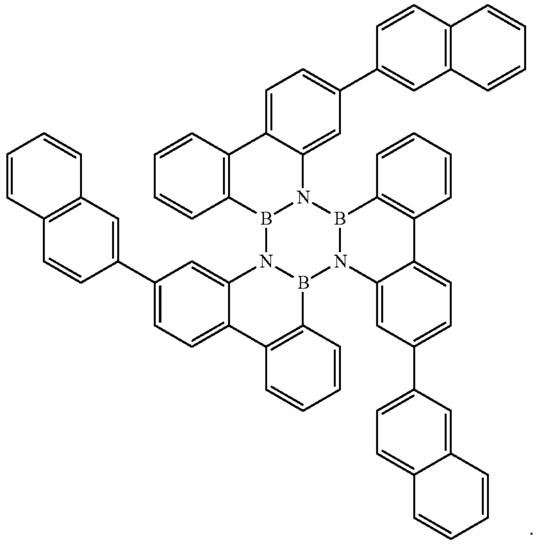

The polycyclic compound of an embodiment may be a material for emitting delayed fluorescence. For example, the polycyclic compound of an embodiment may be a material for emitting thermally activated delayed fluorescence. The organic electroluminescence device 10 of an embodiment may include the polycyclic compound of an embodiment in an emission layer EML and may impart to the device characteristics of high efficiency.

In the organic electroluminescent device 10 of an embodiment, the emission layer EML may emit delayed fluorescence. For example, the emission layer EML may emit thermally activated delayed fluorescence (TADF). The polycyclic compound of an embodiment, included in the emission layer EML, may be used as a TADF dopant.

Though not shown in the drawings, the organic electroluminescence device 10 of an embodiment may include multiple emission layers. The emission layers may be laminated one by one and provided. For example, the organic electroluminescence device 10 including multiple emission layers may emit white light. If the organic electroluminescence device 10 includes multiple emission layers, at least one of the emission layers EML may include the polycyclic compound of an embodiment.

In an embodiment, the emission layer EML includes a host and a dopant and may include the polycyclic compound as the dopant. For example, in the organic electroluminescence device 10 of an embodiment, the emission layer EML may include a host for emitting delayed fluorescence and a dopant for emitting delayed fluorescence and may include the polycyclic compound as the dopant for emitting delayed fluorescence. The emission layer EML may include at least one of the polycyclic compounds represented by Compound Group 1 as a thermally activated delayed fluorescence dopant.

In an embodiment, the emission layer EML may include a known host material. For example, in an embodiment, the emission layer EML may include as a host material, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2"-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), 3,3'-bis(N-carbazolyl)-1,1'-biphenyl (mCBP), 1,3-bis(N-carbazolyl)benzene (mCP), etc. The polycyclic compound of an embodiment may be used as a host material. However, an embodiment of the inventive concept is not limited thereto. Any known host materials for emitting delayed fluorescence other than the suggested host materials may be included.

In the organic electroluminescence device 10 of an embodiment, the emission layer EML may further include a known dopant material. In an embodiment, the emission layer EML may include as a dopant, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

Referring to FIGS. 1 to 4 again, in the organic electroluminescence device 10 of an embodiment, the electron transport region ETR is provided on the emission layer EML. The electron transport region ETR may include at least one of an electron blocking layer HBL, an electron transport layer ETL, and an electron injection layer EIL. However, an embodiment of the inventive concept is not limited thereto.

The electron transport region ETR may have a single layer formed using a single material, a single layer formed using different materials, or a multilayer structure having multiple layers formed using different materials.

For example, the electron transport region ETR may have a single layer structure of an electron injection layer EIL or an electron transport layer ETL, or a single layer structure formed using an electron injection material and an electron transport material. The electron transport region ETR may have a single layer structure having different materials, or a structure laminated from the emission layer EML of electron transport layer ETL/electron injection layer EIL, or hole blocking layer HBL/electron transport layer ETL/electron injection layer EIL, without limitation. The thickness of the electron transport region ETR may be, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL, the electron transport region ETR may include an anthracene-based compound. The electron transport region may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl)anthracene (ADN), or a mixture thereof, without limitation. The thickness of the electron transport layer ETL may be in a range of about 100 Å to about 1,000 Å. For example, thickness of the electron transport layer ETL may be in a range of about 150 Å to about 500 Å. If the thickness of the electron transport layer ETL satisfies the above-described range, satisfactory electron transport properties may be obtained without substantial increase of a driving voltage.

If the electron transport region ETR includes the electron injection layer EIL, the electron transport region ETR may include a metal halide such as LiF, NaCl, CsF, RbCl and RbI, a lanthanide metal such as Yb, a metal oxide such as $Li_2O$ and BaO, or lithium quinolate (LiQ). However, an embodiment of the inventive concept is not limited thereto. The electron injection layer EIL also may be formed using a mixture material of an electron transport material and an insulating organo metal salt. The organo metal salt may be a material having an energy band gap of about 4 eV or more. The organo metal salt may include, for example, metal acetates, metal benzoates, metal acetoacetates, metal acetylacetonates, or metal stearates. The thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above described range, satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), and 4,7-diphenyl-1,10-phenanthroline (Bphen). However, an embodiment of the inventive concept is not limited thereto.

The second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

Though not shown, the second electrode EL2 may be connected with an auxiliary electrode. If the second electrode EL2 is connected with the auxiliary electrode, the resistance of the second electrode EL2 may decrease.

In an embodiment, a capping layer (CPL) may be further disposed on the second electrode EL2 of the organic electroluminescent device 10. The capping layer (CPL) may include, for example, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl) triphenylamine (TCTA), N,N'-bis(naphthalene-1-yl), etc.

The organic electroluminescence device 10 according to an embodiment includes the polycyclic compound of an embodiment in the emission layer EML disposed between the first electrode EL1 and the second electrode EL2, thereby showing excellent emission efficiency and long-life characteristics. The polycyclic compound according to an embodiment may emit thermally activated delayed fluorescence, and the emission layer EML may include the polycyclic compound of an embodiment to emit thermally activated delayed fluorescence and show excellent emission efficiency properties.

The polycyclic compound of an embodiment may be included in a functional layer other than the emission layer EML as a material for the organic electroluminescence device 10. For example, the organic electroluminescence device 10 according to an embodiment may include the polycyclic compound in a capping layer CPL.

Hereinafter, the polycyclic compound according to an embodiment and the organic electroluminescence device of an embodiment of the inventive concept will be explained referring to embodiments and comparative embodiments. The following embodiments are only illustrations to assist the understanding of the inventive concept, and the scope of the inventive concept is not limited thereto.

EXAMPLES

1. Synthesis of Polycyclic Compound of an Embodiment

The synthetic method of the polycyclic compound according to an embodiment will be explained in detail referring to the synthetic methods of Compounds 2, 4 and 7. The synthetic methods of the polycyclic compounds explained below are only embodiments, and the synthetic method of the compound according to an embodiment of the inventive concept is not limited thereto.

(1) Synthesis of Compound 2

Compound 2 according to an embodiment may be synthesized, for example, by the steps of Reaction 1-1 to Reaction 1-3 below.

Synthesis of Compound of [1,1':3',1"-terphenyl]-4'-amine

Compound of [1,1':3',1"-terphenyl]-4'-amine was synthesized by the following Reaction 1-1:

[Reaction 1-1]

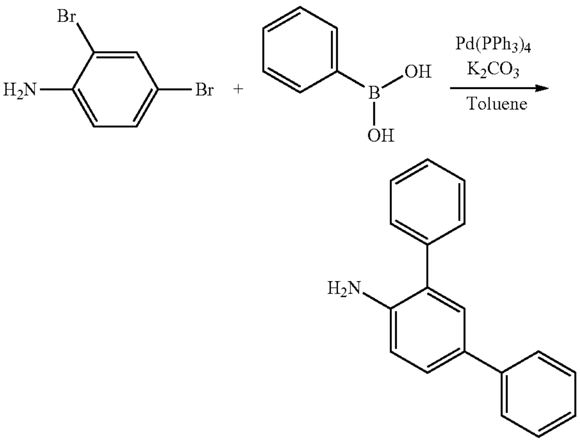

Under a nitrogen atmosphere, in a 500 ml, two-neck round flask, a mixture solution of toluene/water (20%) in which 20 g (79.9 mmol) of 2,4-dibromo-benzenamine, 21.38 g (175.4 mmol) of phenylboron acid, 44.1 g (318.8 mmol) of $K_2CO_3$ and 9.2 g (7.97 mmol) of $Pd(PPh_3)_4$ were dissolved was heated to about 100° C. and stirred for about 12 hours. After finishing the reaction, dichloromethane was added, extraction was carried out three times, $MgSO_4$ was used, and remaining $H_2O$ was removed. After passing through a filter, solvents were evaporated. The crude product thus obtained was separated by silica gel column chromatography (hexane/MC) to obtain 45 g (yield 75%) of a pale yellow solid. The molecular weight of the compound of [1,1':3',1"-terphenyl]-4'-amine, measured by FAB-MS measurement was 245.

Synthesis of Compound of 6-chloro-2-phenyl-5,6-dihydrodibenzo[c,e][1,2]azaborinine The compound of 6-chloro-2-phenyl-5,6-dihydrodibenzo [c,e][1,2]azaborinine was synthesized by the following Reaction 1-2:

[Reaction 1-2]

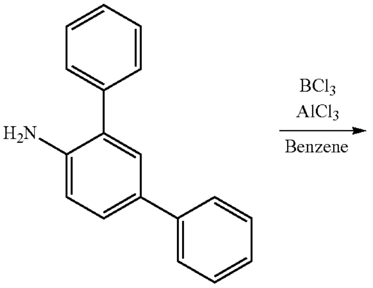

-continued

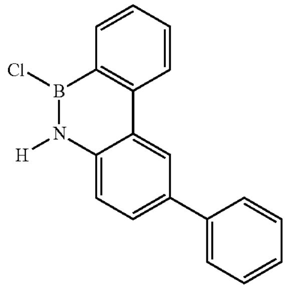

Under a nitrogen atmosphere, to a 500 ml, two-neck round flask, 12 g (102.8 mmol) of trichloroborane dissolved in benzene (50 ml) was put, and 17 g (102.8 mmol) of a compound of [1,1':3',1"-terphenyl]-4'-amine dissolved in benzene (350 ml) was slowly added dropwise using a dropping funnel. After that, the mixture thus obtained was reacted for about 10 hours while refluxing. After finishing the reaction, benzene was removed by distillation under a reduced pressure to obtain N-([1,1'-biphenyl]-2-yl)-1,1-dichloroboranamine. Under a nitrogen atmosphere, to a 500 ml, two-neck round flask, the product thus obtained and aluminum chloride (0.5 g) were put and stood at about 175° C. for about 12 hours. After finishing the reaction, by the separation through sublimation, 2 g of 6-chloro-2-phenyl-5,6-dihydrodibenzo[c,e][1,2]azaborinine was obtained. The molecular weight of the compound of 6-chloro-2-phenyl-5,6-dihydrodibenzo[c,e][1,2]azaborinine, measured by FAB-MS was 732.

Synthesis of Compound 2

Compound 2 was synthesized by the following Reaction 1-3:

[Reaction 1-3]

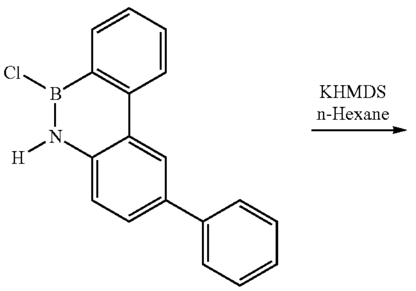

-continued

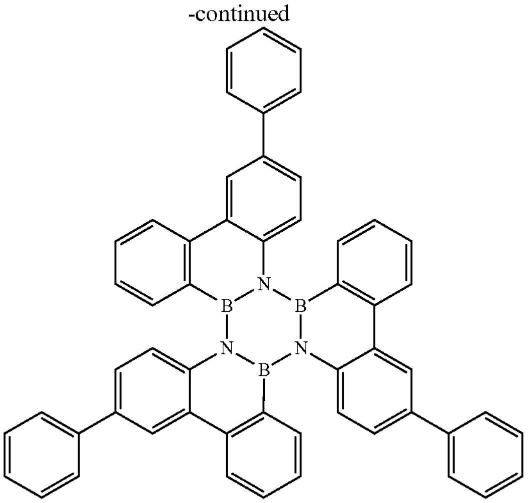

Compound 2

Under a nitrogen atmosphere, to a 250 ml, two-neck round flask, 2 g (9.37 mmol) of 6-chloro-2-phenyl-5,6-dihydrodibenzo[c,e][1,2]azaborinine was put and dissolved in n-hexane. The temperature of the reactor was reduced to about −50° C., and potassium hexamethyldisilazide (KHMDS, 1.88 ml, toluene 0.5 M) was added thereto. The reaction solution was stood at room temperature for about 12 hours, and the brown solid thus produced was filtered. The filtrate was removed using an evaporator. The solid remained was treated with acetone to obtain 0.5 g of Compound 2.

(2) Synthesis of Compound 4

Compound 4 according to an embodiment may be synthesized, for example, by the steps in Reactions 2-1 to 2-3 below.

Synthesis of Compound of 5-(tert-butyl)-[1,1'-biphenyl]-2-amine

The compound of 5-(tert-butyl)-[1,1'-biphenyl]-2-amine was synthesized by the following Reaction 2-1:

[Reaction 2-1]

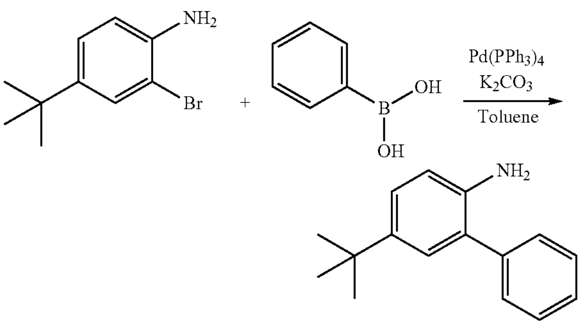

The compound of 5-(tert-butyl)-[1,1'-biphenyl]-2-amine was synthesized by the same method as the synthetic method of the compound of [1,1':3',1"-terphenyl]-4'-amine except for using the reactant of 2-bromo-4-(tert-butyl)aniline instead of the reactant of 2,4-dibromo-benzeneamine in the synthetic method of the compound of [1,1':3',1"-terphenyl]-4'-amine.

Synthesis of Compound of 2-(tert-butyl)-6-chloro-5,6-dihydrodibenzo[c,e][1,2]azaborinine The compound of 2-(tert-butyl)-6-chloro-5,6-dihydrodibenzo[c,e][1,2]azaborinine was synthesized by the following Reaction 2-2:

[Reaction 2-2]

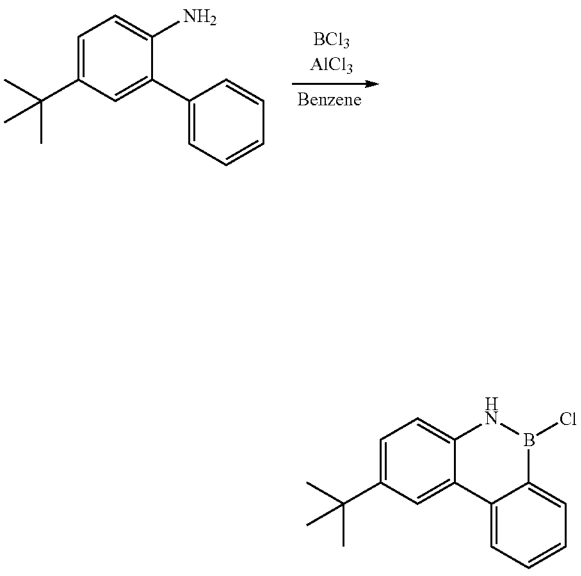

The compound of 2-(tert-butyl)-6-chloro-5,6-dihydrodibenzo[c,e][1,2]azaborinine was synthesized by the same method as the synthetic method of the compound of 6-chloro-2-phenyl-5,6-dihydrodibenzo[c,e][1,2]azaborinine except for using the reactant of 5-(tert-butyl)-[1,1'-biphenyl]-2-amine instead of the reactant of [1,1':3',1"-terphenyl]-4'-amine in the synthetic method of the compound of 6-chloro-2-phenyl-5,6-dihydrodibenzo[c,e][1,2]azaborinine.

Synthesis of Compound 4

Compound 4 was synthesized by the following Reaction 2-3:

[Reaction 2-3]

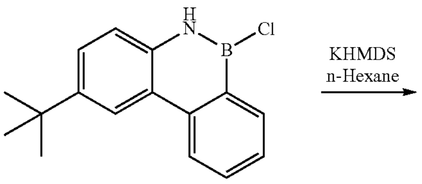

-continued

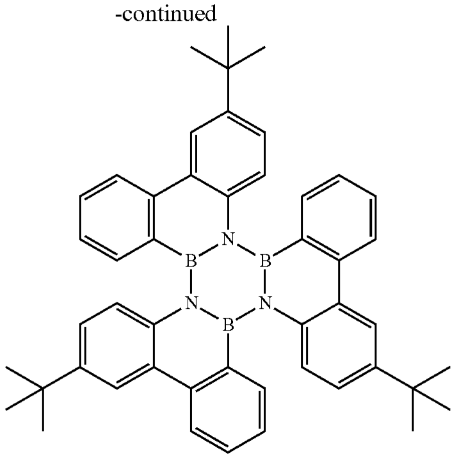

Compound 4

Compound 4 was synthesized by the same method as the synthetic method of Compound 2 except for using the reactant of 2-(tert-butyl)-6-chloro-5,6-dihydrodibenzo[c,e][1,2]azaborinine instead of the reactant of 6-chloro-2-phenyl-5,6-dihydrodibenzo[c,e][1,2]azaborinine in the synthetic method of Compound 2.

(3) Synthesis of Compound 7

Compound 7 according to an embodiment may be synthesized, for example, by the steps of Reactions 3-1 to 3-3 below.

Synthesis of Compound of N5,N5-diphenyl-[1,1'-biphenyl]-2,5-diamine

The compound of N5,N5-diphenyl-[1,1'-biphenyl]-2,5-diamine was synthesized by the following Reaction 3-1:

[Reaction 3-1]

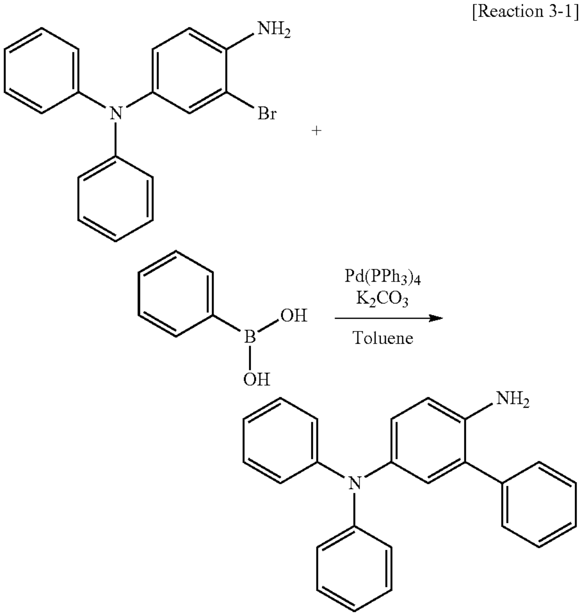

The compound of N5,N5-diphenyl-[1,1'-biphenyl]-2,5-diamine was synthesized by the same method as the synthetic method of [1,1':3',1"-terphenyl]-4'-amine except for using the reactant of 3-bromo-N1,N1-diphenylbenzene-1,4-diamine instead of the reactant of 2,4-dibromo-benzenamine in the synthetic method of the compound of [1,1':3',1"-terphenyl]-4'-amine.

Synthesis of Compound of 6-chloro-N,N-diphenyl-5,6-dihydrodibenzo[c,e][1,2]azaborinin-2-amine The compound of 6-chloro-N,N-diphenyl-5,6-dihydrodibenzo[c,e][1,2]azaborinin-2-amine was synthesized by the following Reaction 3-2:

[Reaction 3-2]

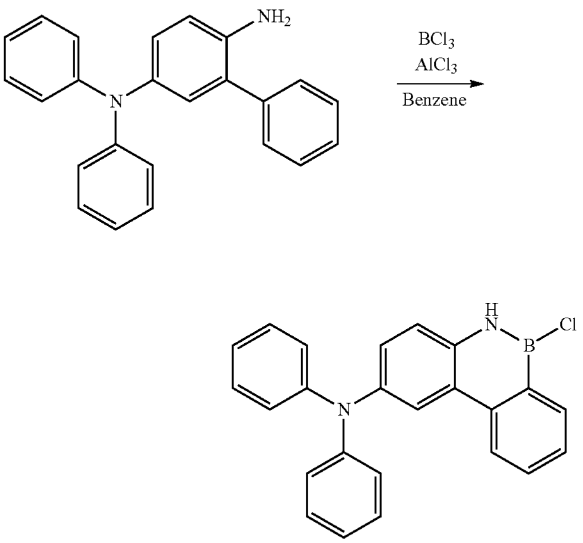

The compound of 6-chloro-N,N-diphenyl-5,6-dihydrodibenzo[c,e][1,2]azaborinin-2-amine was synthesized by the same method as the synthetic method of the compound of 6-chloro-2-phenyl-5,6-dihydrodibenzo[c,e][1,2]azaborinine except for using the reactant of N5,N5-diphenyl-[1,1'-biphenyl]-2,5-diamine instead of [1,1':3',1"-terphenyl]-4'-amine in the synthetic method of the compound of 6-chloro-2-phenyl-5,6-dihydrodibenzo[c,e][1,2]azaborinine.

Synthesis of Compound 7

Compound 7 was synthesized by the following Reaction 3-3:

[Reaction 3-3]

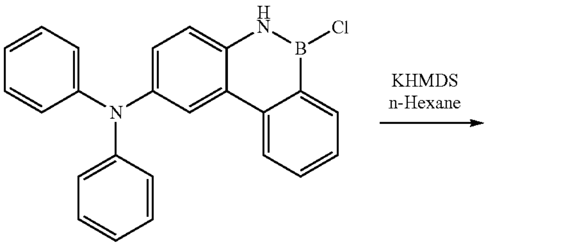

-continued

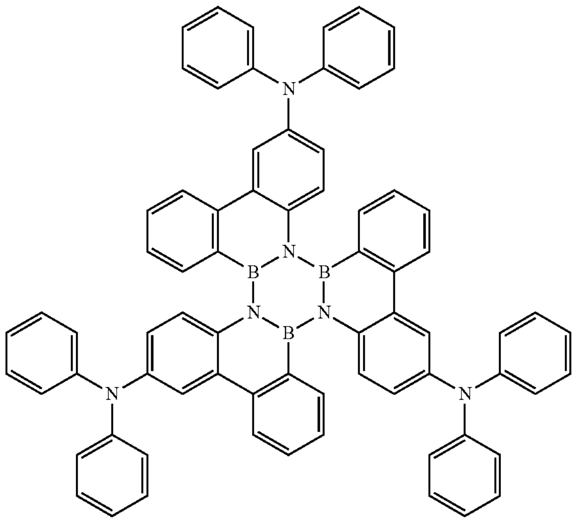

Compound 7

Compound 7 was synthesized by the same method as the synthetic method of Compound 2 except for using the reactant of 6-chloro-N,N-diphenyl-5,6-dihydrodibenzo[c,e][1,2]azaborinin-2-amine instead of the reactant of 6-chloro-2-phenyl-5,6-dihydrodibenzo[c,e][1,2]azaborinine in the synthetic method of Compound 2.

2. Evaluation of Polycyclic Compound and Manufacture and Evaluation of Organic Electroluminescence Device Including the Polycyclic Compound The properties of the polycyclic compound of an embodiment, and the evaluation of the organic electroluminescence device of an embodiment, including the polycyclic compound of an embodiment in an emission layer were conducted by the methods below. The manufacturing method of the organic electroluminescence device for evaluating the device is described below.

Organic electroluminescence devices of Examples 1 to 3 were manufactured using the polycyclic compound of Compound 2, Compound 4, and Compound 7 as the dopant materials of an emission layer.

Comparative Examples 1 corresponds to an organic electroluminescence device manufactured using Comparative Compound C1 instead of the polycyclic compounds of embodiments as the dopant material of an emission layer.

The compounds used in Example 1 to Example 3 and Comparative Example 1 are shown in Table 1 below.

TABLE 1

Compound 2

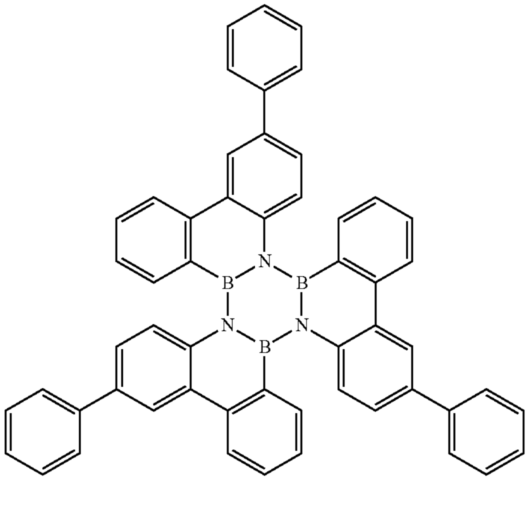

2

Compound 4

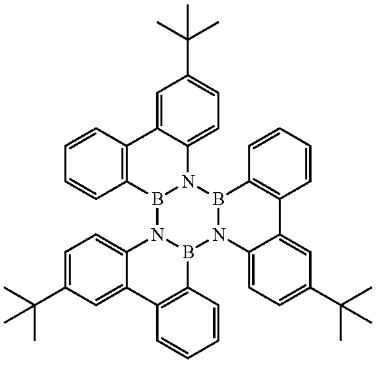

4

Compound 7

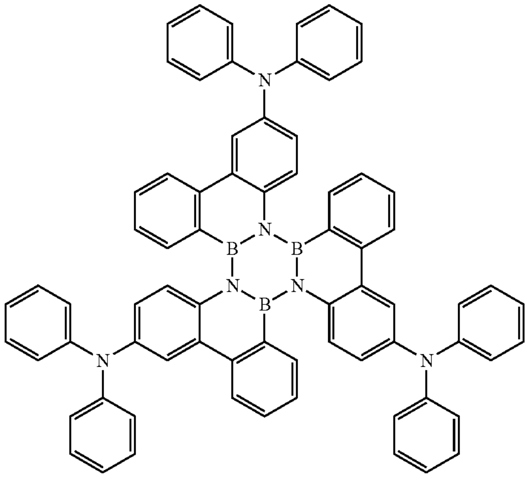

7

Comparative Compound C1

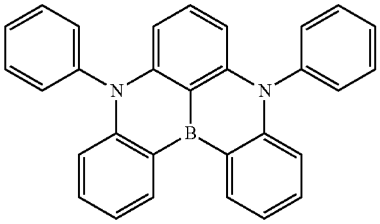

C1

(Evaluation of the Properties of Polycyclic Compounds)

The highest occupied molecular orbital (HOMO), the lowest unoccupied molecular orbital (LUMO), the energy gap (Eg), the lowest triplet excitation energy (T1), the lowest singlet excitation energy (S1), and the oscillator strength of Compound 2, Compound 4, Compound 7 and Comparative Compound C1 were calculated through simulation by a density functional theory (DFT) method based on B3LYP using a Gaussian 09 program and shown. $\Delta E_{ST}$ represents a difference value between the lowest triplet excitation energy and the lowest singlet excitation energy.

TABLE 2

| Division | HOMO (eV) | LUMO (eV) | $E_g$ (eV) | T1 (eV) | S1 (eV) | Oscillator strength | $\Delta E_{ST}$ |
|---|---|---|---|---|---|---|---|
| Compound 2 | −5.37 | −1.58 | 3.79 | 2.78 | 3.01 | 0.39 | 0.23 |
| Compound 4 | −5.4 | −1.50 | 3.90 | 2.75 | 3.06 | 0.39 | 0.31 |
| Compound 7 | −5.10 | −1.65 | 3.45 | 2.70 | 2.90 | 0.45 | 0.2 |
| Comparative Compound C1 | −5.00 | −1.37 | 3.64 | 2.62 | 3.10 | 0.19 | 0.48 |

Referring to Table 2, Compounds 2, 4 and 7 of embodiments showed smaller $\Delta E_{ST}$ values when compared with Comparative Compound C1 and may be used as thermally activated delayed fluorescence dopants.

(Manufacture of Organic Electroluminescence Device)

On a glass substrate, ITO with a thickness of about 1,200 Å was patterned and washed with ultra-pure water, cleaned with ultrasonic waves, exposed to UV for about 30 minutes and treated with ozone. NPD was deposited to a thickness of about 300 Å to form a hole injection layer, and TCTA was deposited to about 200 Å to form a hole transport layer. CzSi was deposited to a thickness of about 100 Å as the hole transport layer compound.

The polycyclic compound of an embodiment or the Comparative Compound were co-deposited with mCP in a ratio of 1:99 to form an emission layer into a thickness of about 200 Å. The emission layer formed by the co-deposition was conducted by mixing each of Compounds 2, 4 and 7 with mCP and depositing in Example 1 to Example 3, respectively, or by mixing Comparative Compound C1 with mCP and depositing in Comparative Example 1. On the emission layer, a layer with a thickness of about 200 Å was formed using TSPO1, a layer with a thickness of about 300 Å was formed using TPBi, and a layer with a thickness of about 10 Å was formed using LiF to form an electron transport region. A second electrode with a thickness of about 3,000 Å was formed using aluminum (Al).

In this example, the hole transport region, the emission layer, the electron transport region, and the second electrode were formed using a vacuum deposition apparatus.

(Evaluation of Properties of Organic Electroluminescence Device)

In Table 3, the evaluation results on the organic electroluminescence devices of Example 1 to Example 3, and Comparative Example 1 are shown. In Table 3, the driving voltage, the emission efficiency, and the maximum quantum efficiency of the organic electroluminescence devices thus manufactured are compared and shown. In the evaluation results on the properties for the Examples and the Comparative Example shown in Table 3, the driving voltage and current density were measured using a source (Keithley Instrument Co., 2400 series). The emission efficiency shows a current efficiency value with respect to a current density of 10 $mA/cm^2$.

TABLE 3

| Device manufacturing example | Emission layer dopant material | Driving voltage (V) | Emission efficiency (Cd/A) | Maximum quantum efficiency (%) | Emission color |
|---|---|---|---|---|---|
| Example 1 | Compound 2 | 4.2 | 23.1 | 24.1 | Blue |
| Example 2 | Compound 4 | 4.5 | 20 | 21.8 | Blue |
| Example 3 | Compound 7 | 4.7 | 27 | 22.2 | Blue |
| Comparative Example 1 | Comparative Compound C1 | 5.6 | 19.4 | 19.1 | Blue |

Referring to the results of Table 3, the organic electroluminescence devices of Example 1 to Example 3, using the polycyclic compounds according to embodiments of the inventive concept as materials for an emission layer, showed lower driving voltage values, and relatively higher emission efficiency and maximum quantum efficiency when compared with the organic electroluminescence device of Comparative Example 1.

The Example Compounds may show multi-resonance due to numbers of the condensed ring structures, and accordingly, the organic electroluminescence devices of embodiments may show improved emission efficiency when compared with the organic electroluminescence device of the Comparative Example.

In the polycyclic compound of an embodiment, aryl groups are combined with all ring-forming atoms of a borazine group which includes three boron (B) atoms and three nitrogen (N) atoms, and two adjacent aryl groups among six aryl groups are connected in pair, and multi-resonance in the molecule of the compound is activated. Accordingly, if used as the material for the emission layer of the organic electroluminescence device, the polycyclic compound may contribute to the increase of the life and the improvement of the efficiency drop phenomenon of the organic electroluminescence device.

Since the organic electroluminescence device of an embodiment includes a polycyclic compound in which a borazine group of a six-member ring is combined with an aryl group to achieve multi-resonance, device properties including the increase of life and the improvement of efficiency drop phenomenon may be shown.

The organic electroluminescence device of an embodiment may show device properties including long life and improved efficiency drop phenomenon.

The polycyclic compound of an embodiment is included in an emission layer of an organic electroluminescence device and may contribute to the increase of the life and the improvement of efficiency drop phenomenon of the organic electroluminescence device.

Although the embodiments of the invention have been described, it is understood that the invention should not be limited to these embodiments but various changes and modifications can be made by one ordinary skilled in the art within the spirit and scope of the invention as hereinafter claimed.

What is claimed is:

1. An organic electroluminescence device, comprising:
a first electrode;
a second electrode disposed on the first electrode; and
an emission layer disposed between the first electrode and the second electrode,
wherein the first electrode and the second electrode each independently comprise at least one selected from the group consisting of Ag, Mg, Cu, Al, Pt, Pd, Au, Ni, Nd, Ir, Cr, Li, Ca, LiF/Ca, LiF/Al, Mo, Ti, In, Sn, Zn, an oxide thereof, a compound thereof, and a mixture thereof, and
the emission layer comprises a polycyclic compound represented by Formula 1:

[Formula 1]

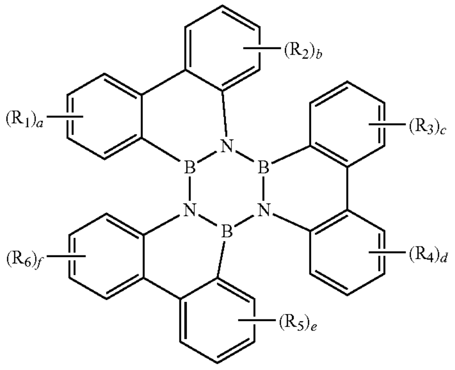

wherein in Formula 1,
a to f are each independently an integer from 0 to 4,
$R_1$ to $R_6$ are each independently a deuterium atom, a halogen atom, a cyano group, a substituted or unsubstituted amino group, a substituted or unsubstituted silyl group, a substituted or unsubstituted alkyl group of 1 to 10 carbon atoms, a substituted or unsubstituted aryl group of 6 to 60 carbon atoms, or a substituted or unsubstituted heterocyclic group of 2 to 60 carbon atoms, when a is zero (0), $R_1$ is not present, when b is zero (0), $R_2$ is not present, when c is zero (0), $R_3$ is not present, when d is zero (0), $R_4$ is not present, when e is zero (0), $R_5$ is not present, and when f is zero (0), $R_6$ is not present.

2. The organic electroluminescence device of claim 1, wherein $R_1$ to $R_6$ are each independently represented by one of groups AR-1 to AR-5:

AR-1

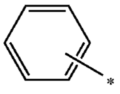

AR-2

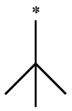

AR-3

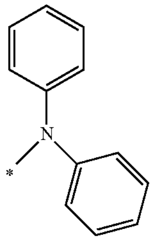

AR-4

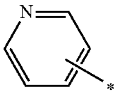

AR-5

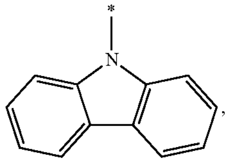

wherein for groups AR-1 to AR-5,

* indicates a binding site to a neighboring atom.

3. The organic electroluminescence device of claim 1, wherein one of a or b is 1, one of c or d is 1, one of e or f is 1, and the remainder are 0.

4. The organic electroluminescence device of claim 1, wherein if a, c, and e are each 1, and if b, d, and f are each 0, then $R_1$, $R_3$ and $R_5$ are the same.

5. The organic electroluminescence device of claim 1, wherein if a, c, and e are each 0, and if b, d, and f are each 1, then $R_2$, $R_4$ and $R_6$ are the same.

6. The organic electroluminescence device of claim 1, wherein the emission layer emits delayed fluorescence.

7. The organic electroluminescence device of claim 1, wherein the emission layer comprises a host and a dopant, and the dopant comprises the polycyclic compound represented by Formula 1.

8. The organic electroluminescence device of claim 1, wherein the emission layer comprises a host and a dopant, and the host comprises the polycyclic compound represented by Formula 1.

9. The organic electroluminescence device of claim 1, wherein the emission layer emits light having a central wavelength in a range of about 430 nm to about 470 nm.

10. The organic electroluminescence device of claim 1, further comprising a capping layer disposed on the second electrode, the capping layer comprising the polycyclic compound represented by Formula 1.

11. The organic electroluminescence device of claim 1, wherein the polycyclic compound is one selected from Compound Group 1:

[Compound Group 1]

1

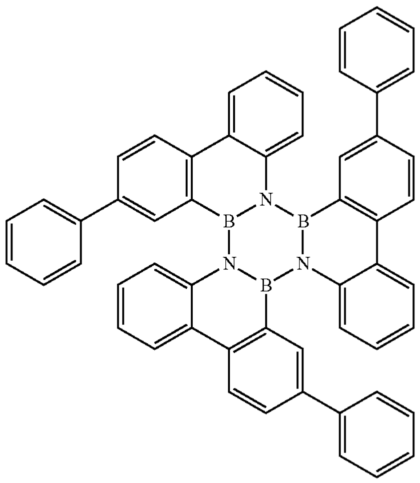

2

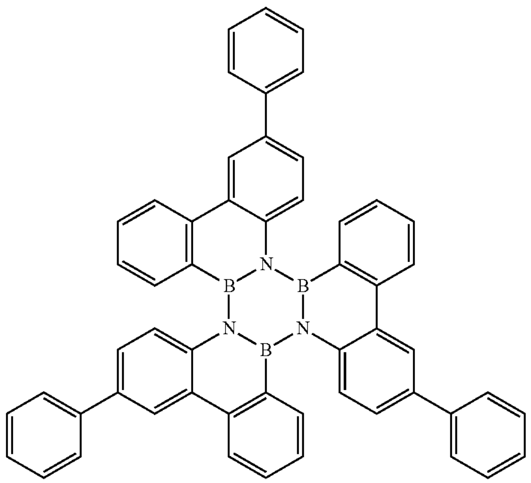

-continued
3
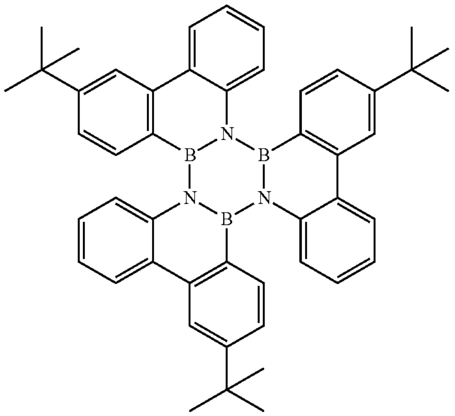
5
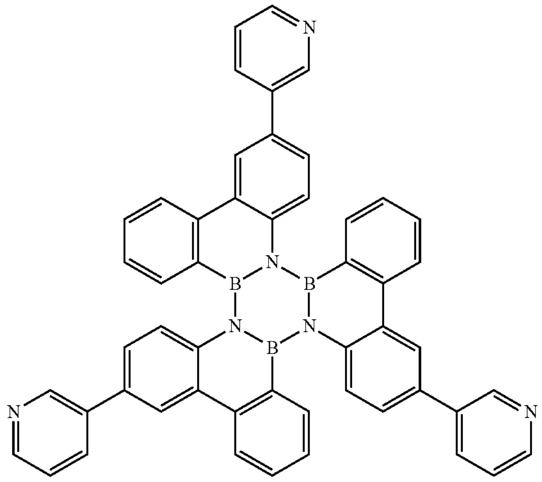
6
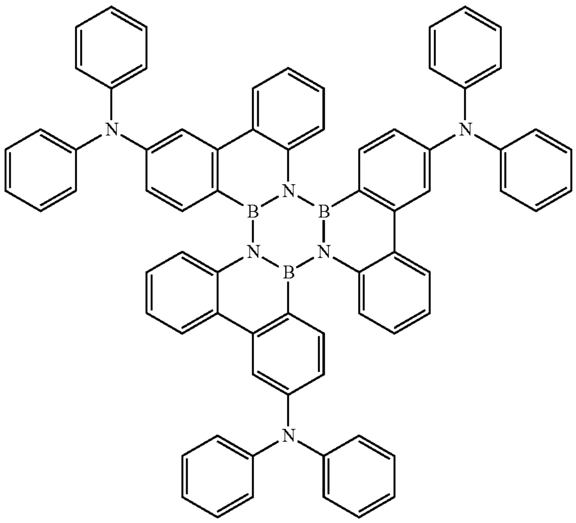
-continued
7
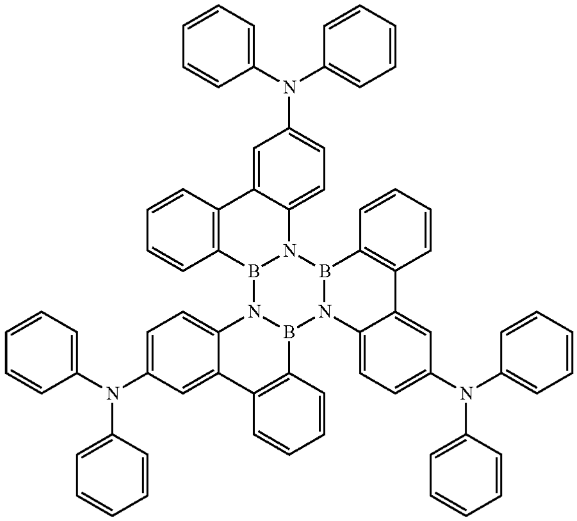
8
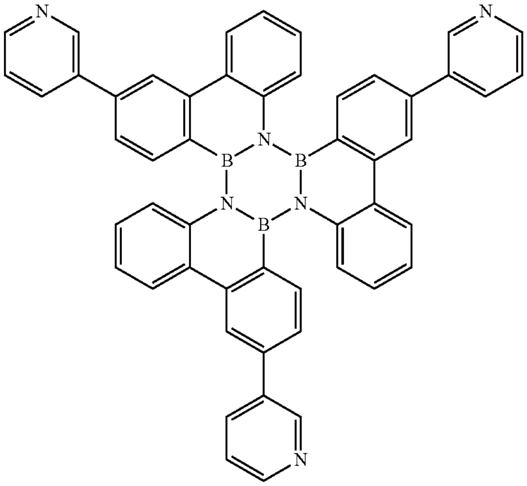
9
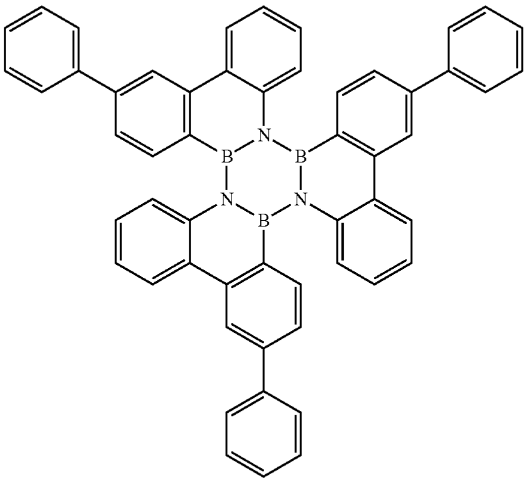

-continued
10
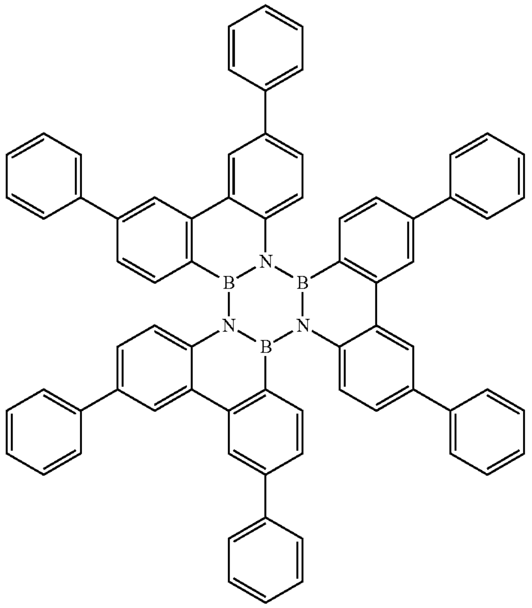
11
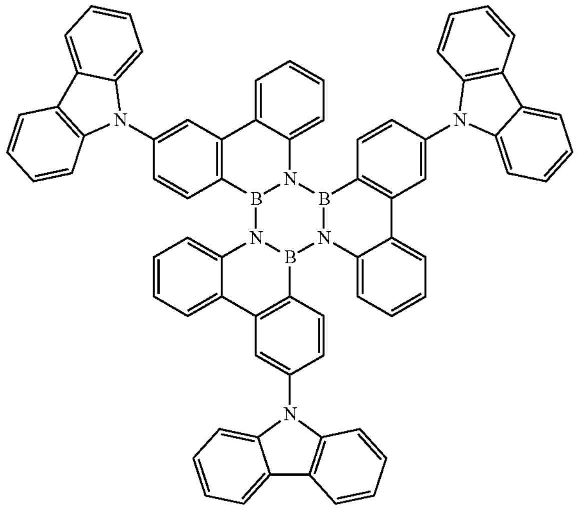
12
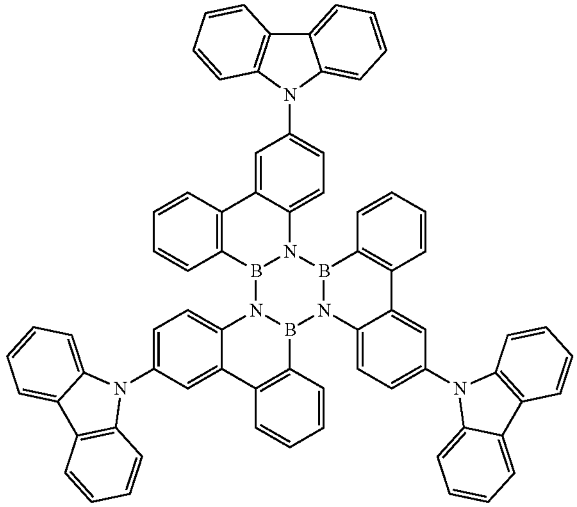
-continued
13
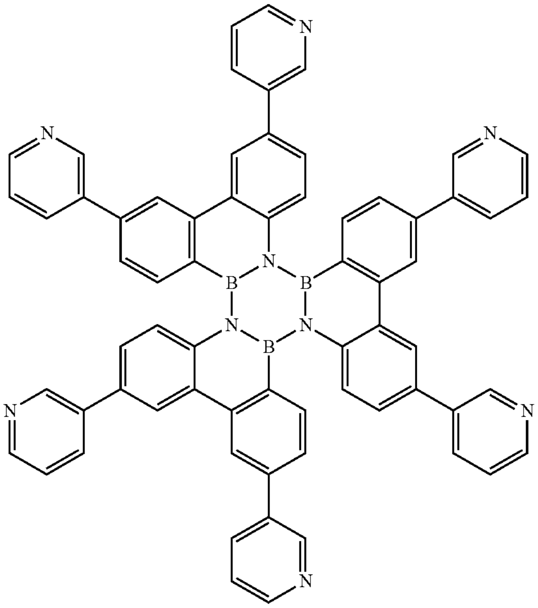
14
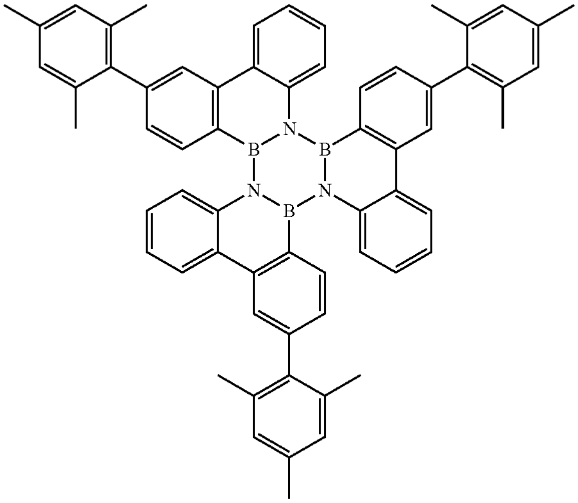
15
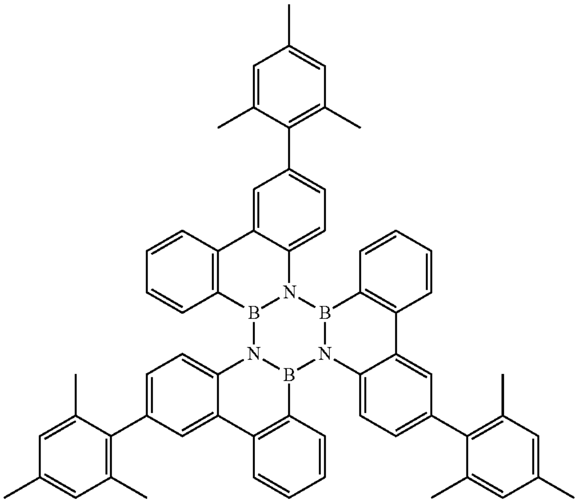

16
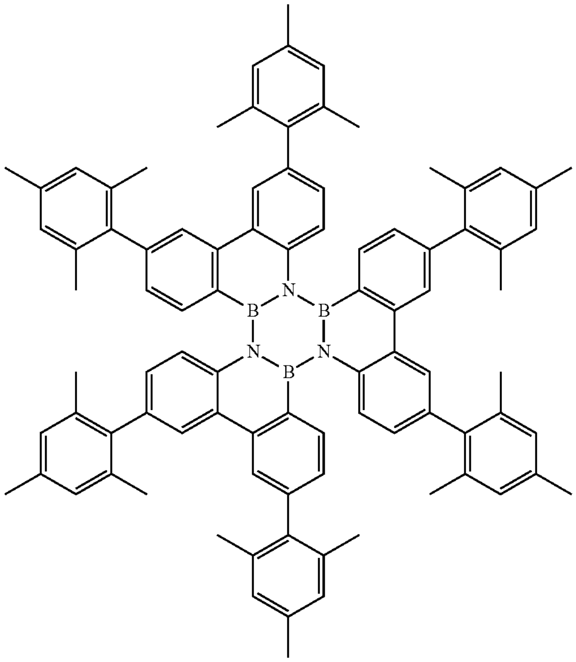
17
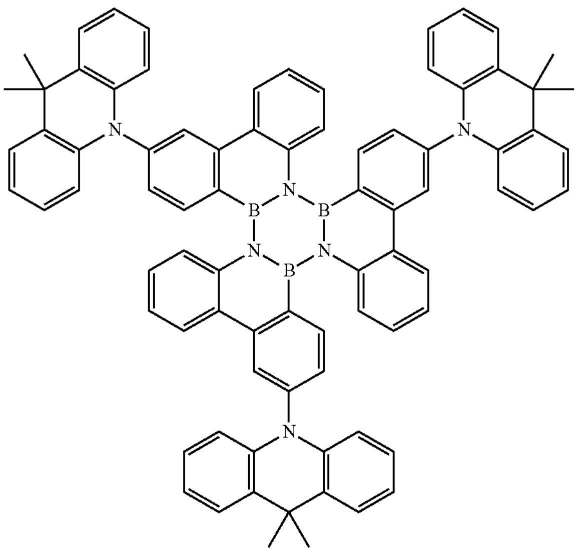
18
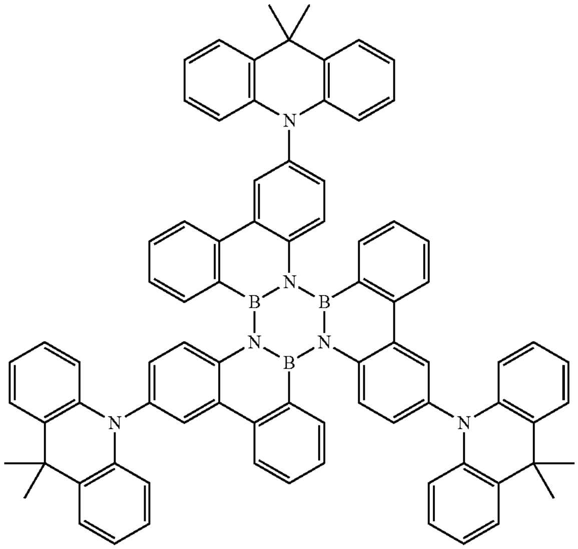
19
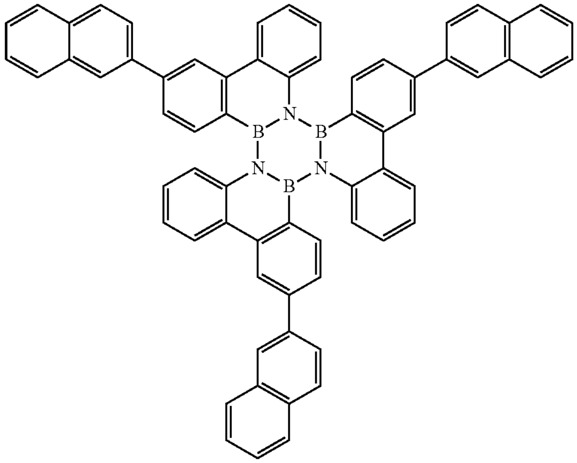
20
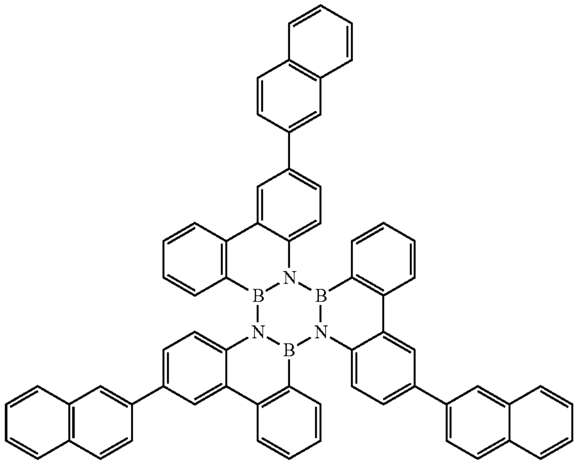

-continued
21
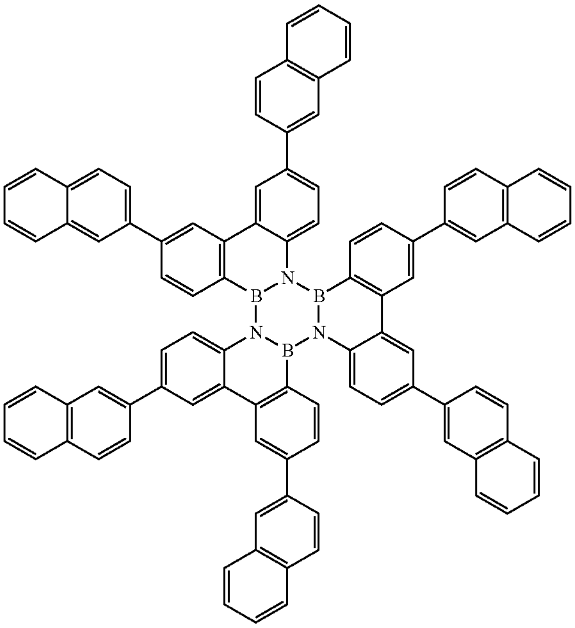
22
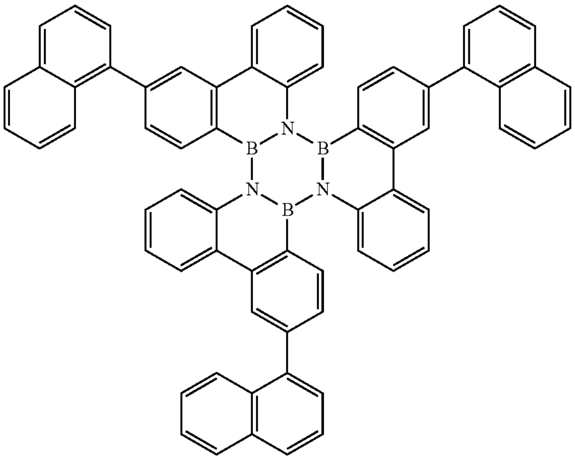
23
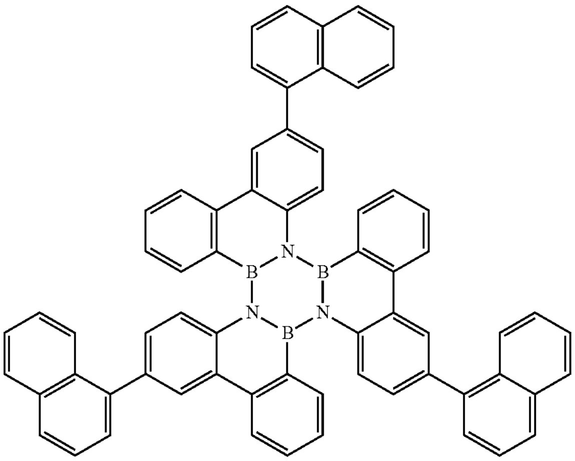
-continued
24
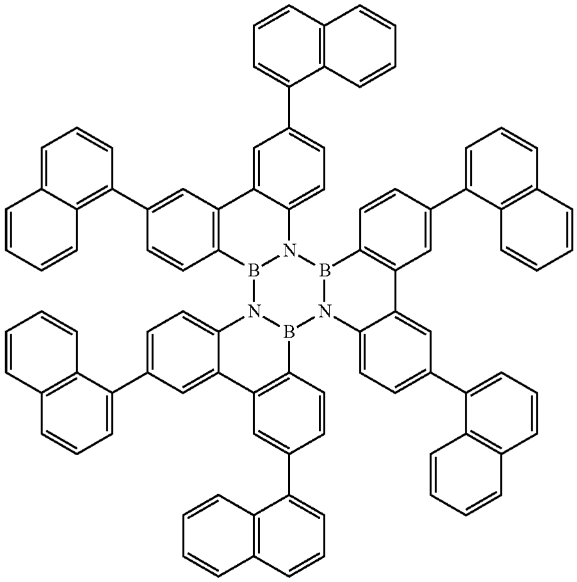
25
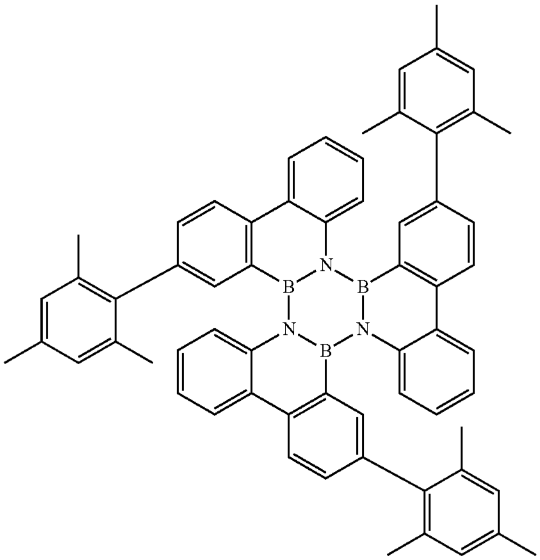

-continued
26
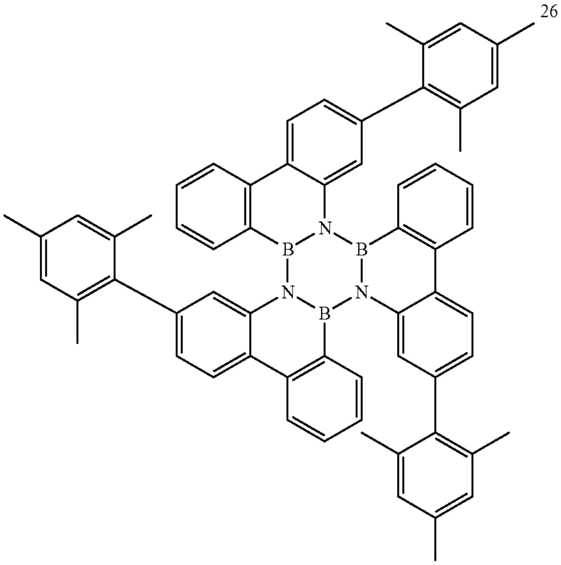
27
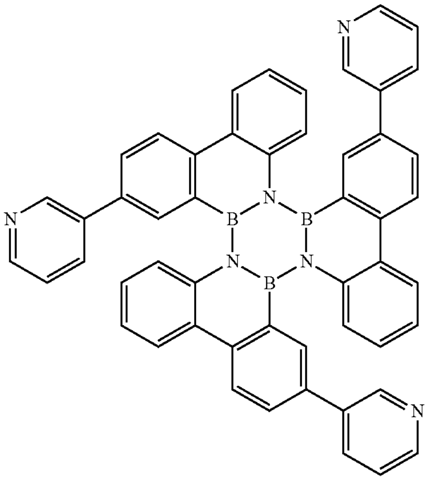
28
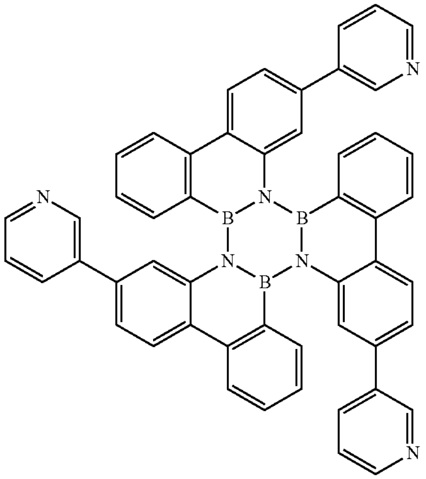
-continued
29
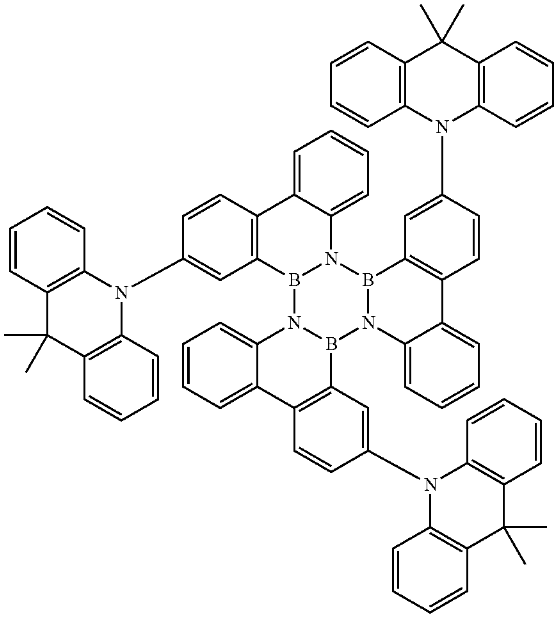
30
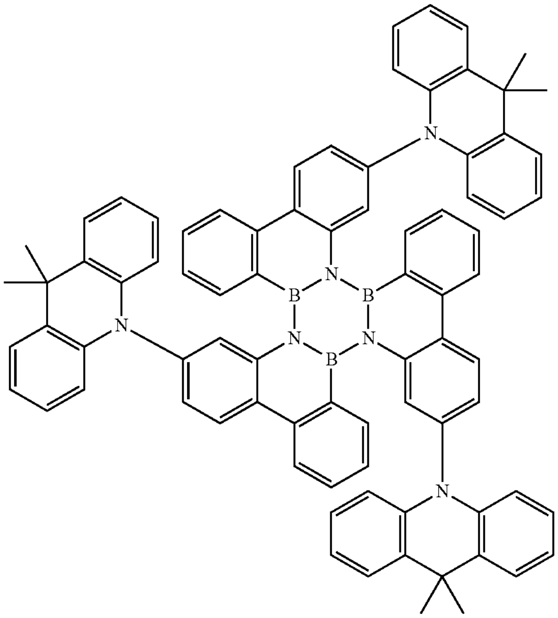

-continued

31

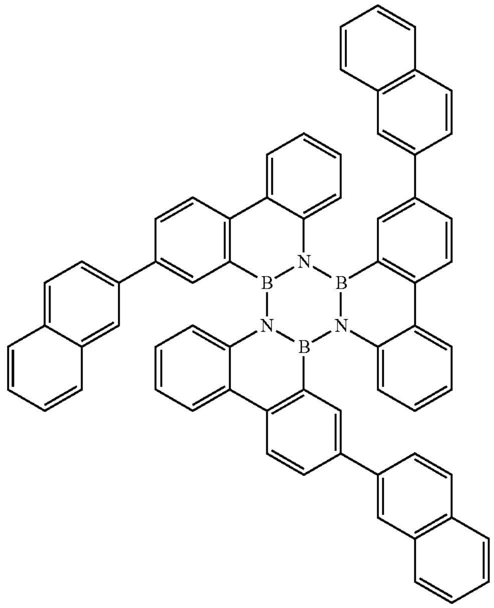

32

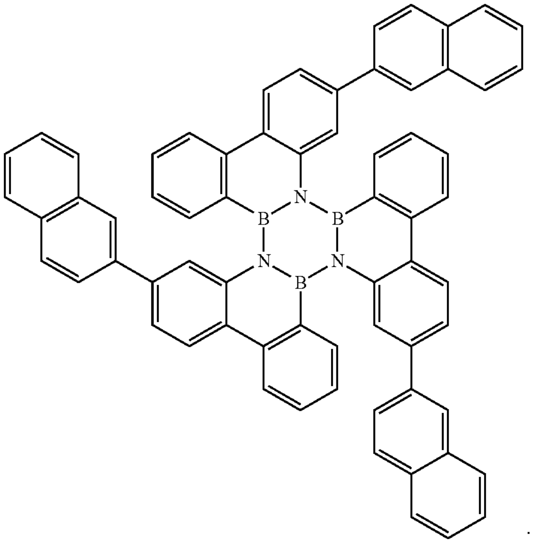

.

12. A polycyclic compound represented by Formula 1:

[Formula 1]

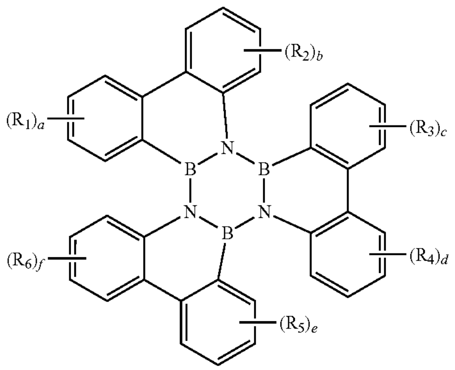

wherein in Formula 1, a to f are each independently an integer from 0 to a sum of a to f is 3 or greater, $R_1$, $R_3$ and $R_5$ are each independently a deuterium atom, a cyano group, a substituted or unsubstituted amino group, a substituted or unsubstituted silyl group, a substituted or unsubstituted alkyl group of 1 to 10 carbon atoms, a substituted or unsubstituted aryl group of 6 to 60 carbon atoms, or a substituted or unsubstituted heterocyclic group of 2 to 60 carbon atoms, $R_2$, $R_4$, and $R_6$ are each independently a deuterium atom, a cyano group, a substituted or unsubstituted amino group, a substituted or unsubstituted silyl group, a substituted or unsubstituted aryl group of 6 to 60 carbon atoms, or a substituted or unsubstituted heterocyclic group of 2 to 60 carbon atoms, when a is zero (0), $R_1$ is not present, when b is zero (0), $R_2$ is not present, when c is zero (0), $R_3$ is not present, when d is zero (0), $R_4$ is not present, when e is zero (0), $R_5$ is not present, and when f is zero (0), $R_6$ is not present.

13. The polycyclic compound of claim 12, wherein $R_1$ to $R_6$ are each independently represented by one of groups AR-1 to AR-5:

AR-1

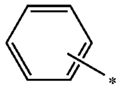

AR-2

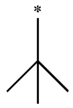

AR-3

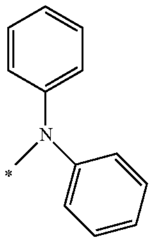

AR-4

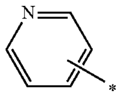

AR-5

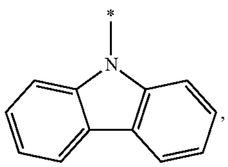

wherein for groups AR-1 to AR-5,

* indicates a binding site to a neighboring atom.

14. The polycyclic compound of claim 12, wherein one of a or b is 1, one of c or d is 1, one of e or f is 1, and the remainder are 0.

15. The polycyclic compound of claim 12, wherein if a, c, and e are each 1, and if b, d, and f are each 0, then $R_1$, $R_3$ and $R_5$ are the same.

16. The polycyclic compound of claim 12, wherein if a, c, and e are each 0, and if b, d, and f are each 1, then $R_2$, $R_4$ and $R_6$ are the same.

17. The polycyclic compound of claim 12, wherein a to f are each 1, and $R_1$ to $R_6$ are each a phenyl group.

18. The polycyclic compound of claim 12, wherein the polycyclic compound represented by Formula 1 is a material emitting thermally activated delayed fluorescence.

19. The polycyclic compound of claim 12, wherein the polycyclic compound represented by Formula 1 is a blue dopant.

20. The polycyclic compound of claim 12, wherein the polycyclic compound represented by Formula 1 is one selected from Compound Group 1:

[Compound Group 1]

1

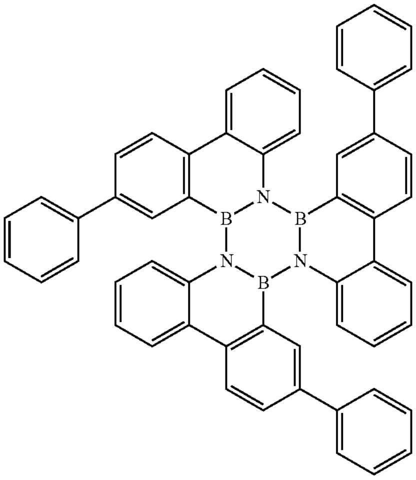

2

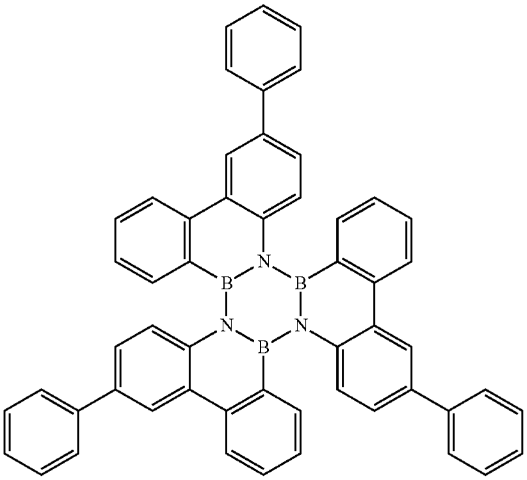

-continued

3

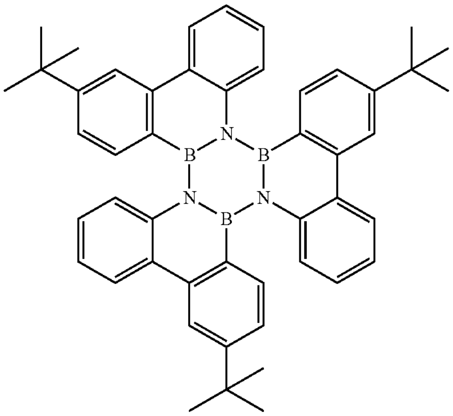

5

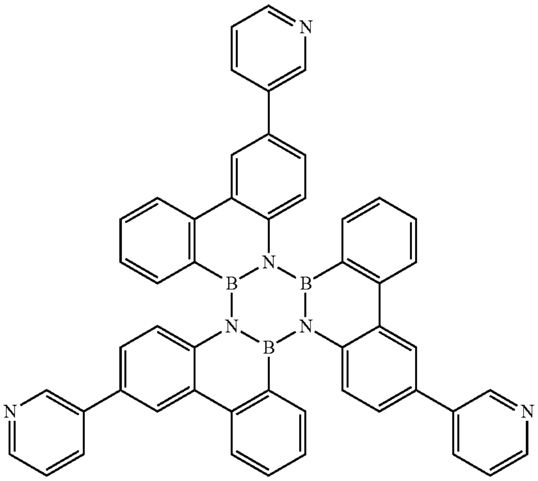

6

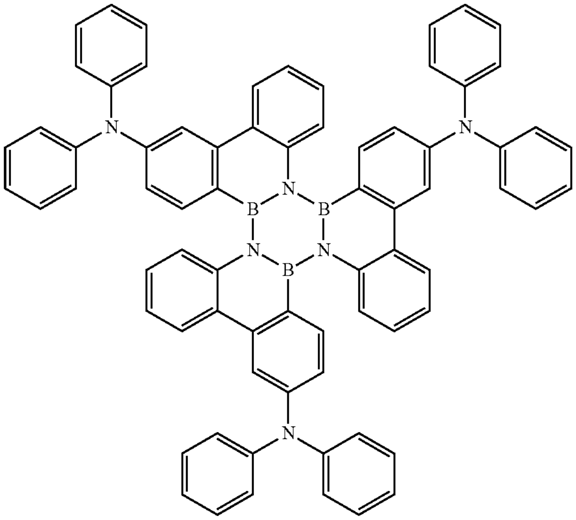

7
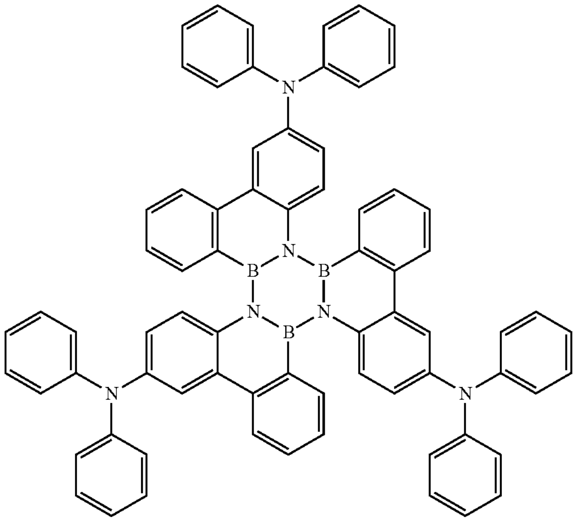
8
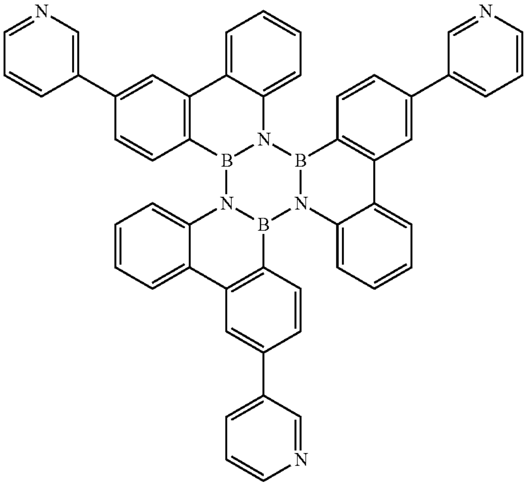
9
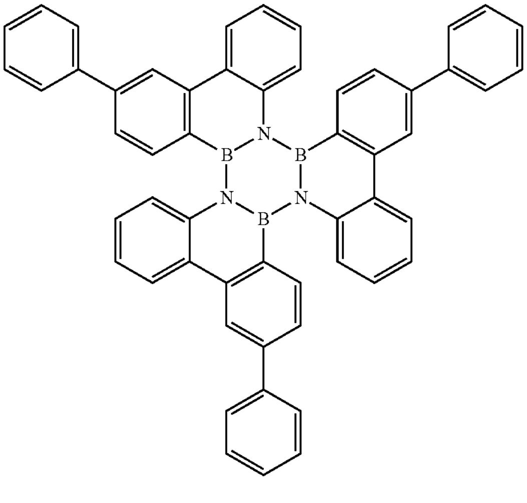
10
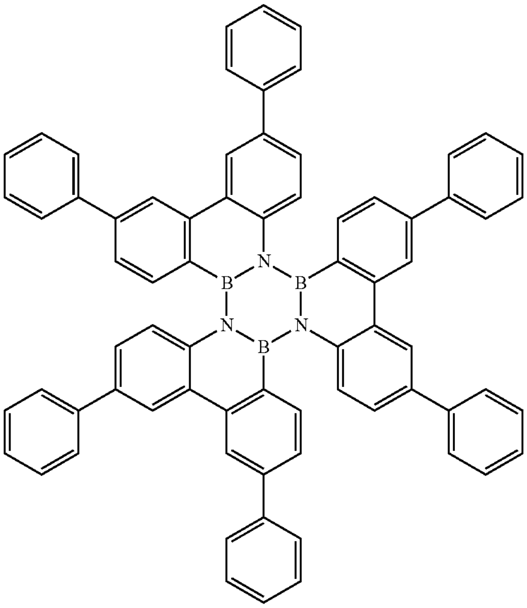
11
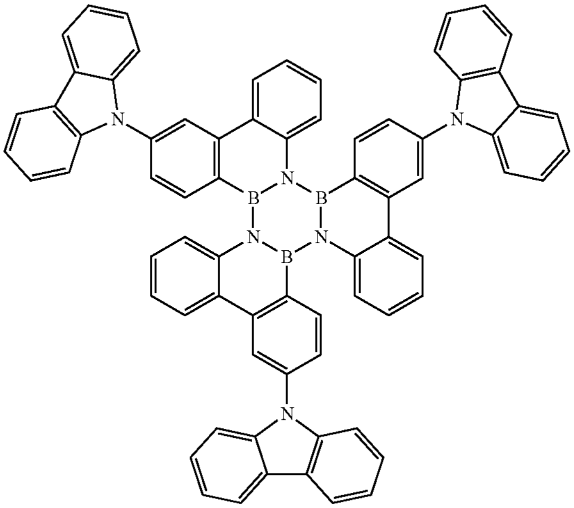

-continued
12
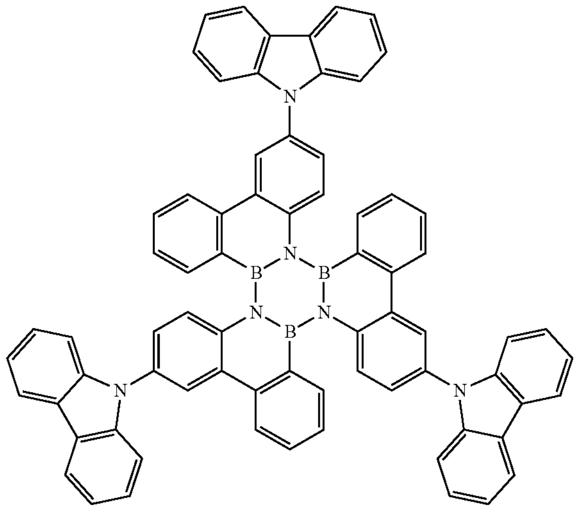
13
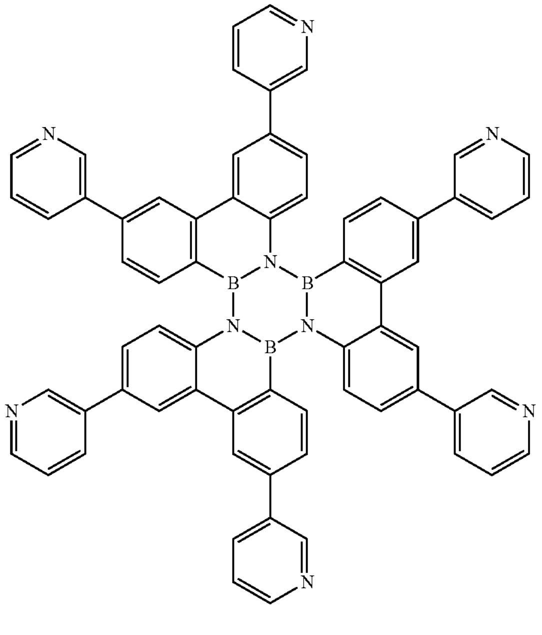
-continued
14
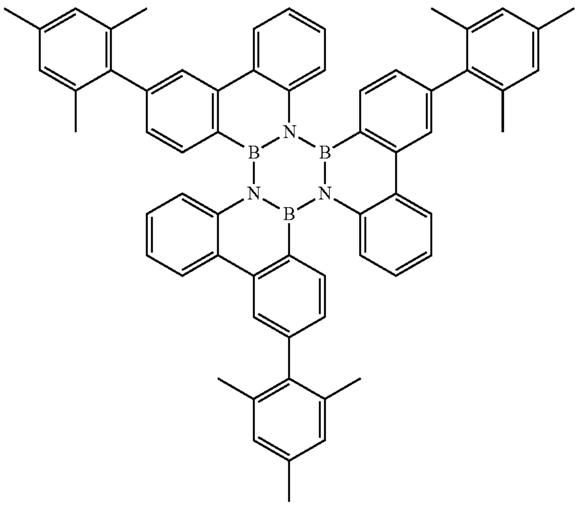
15
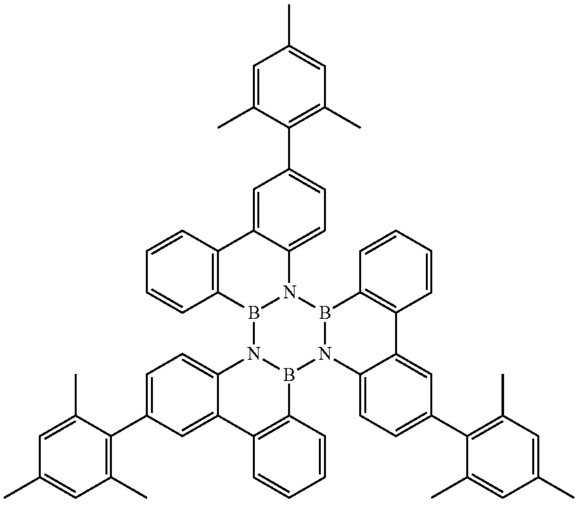

-continued
16
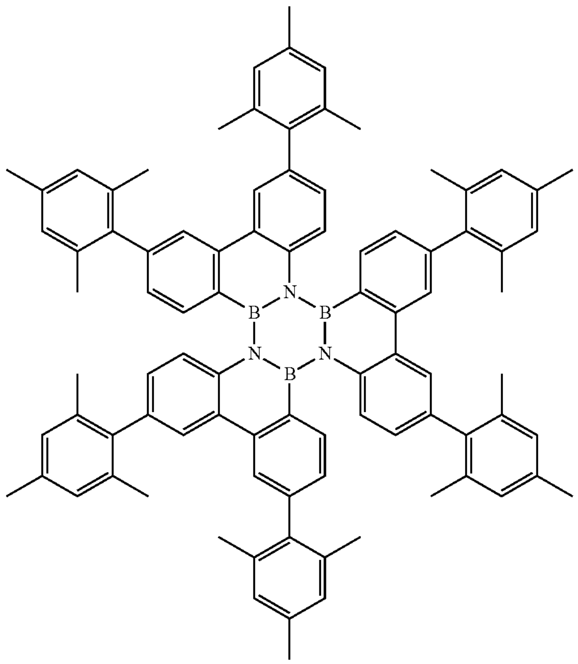
17
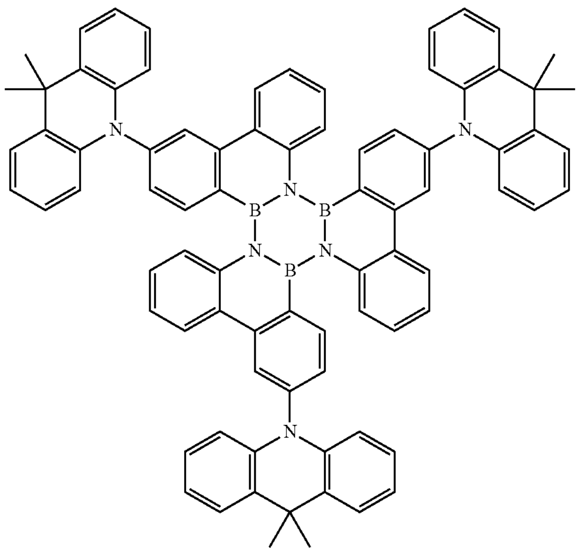
-continued
18
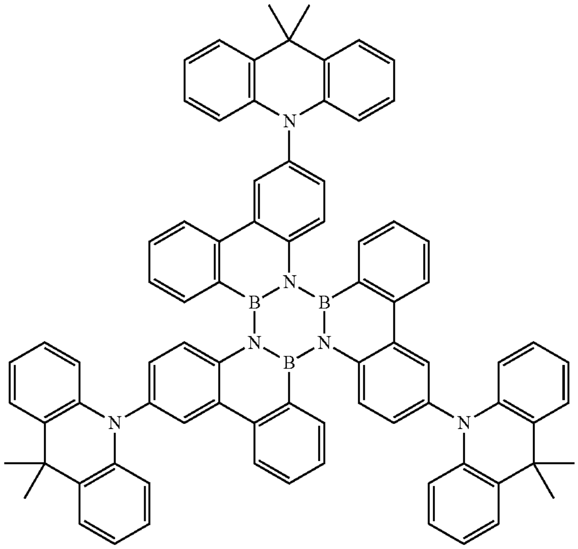
19
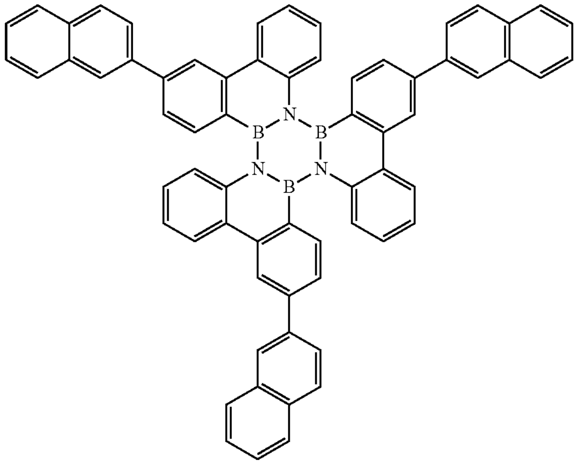
20
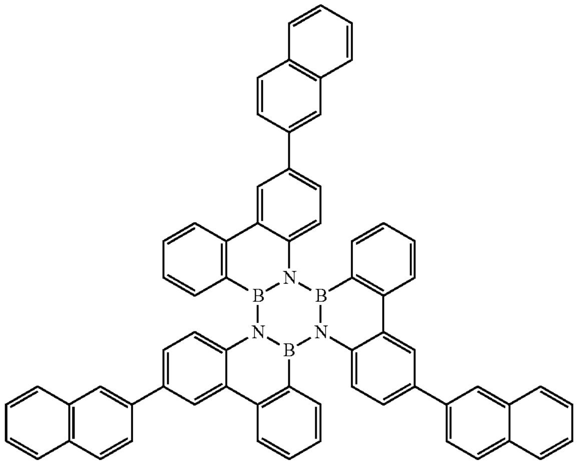

21
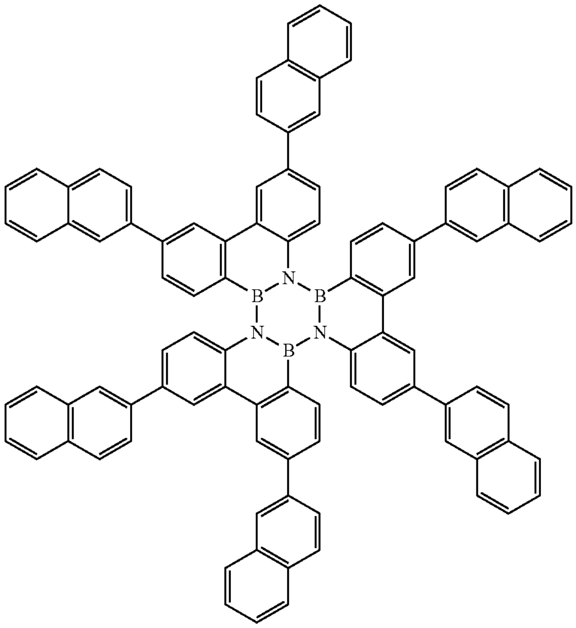
22
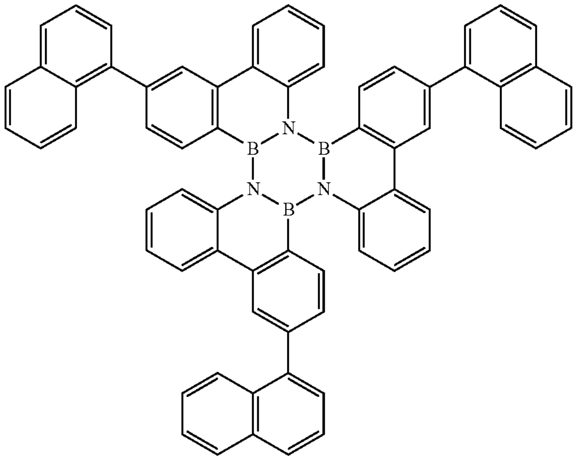
23
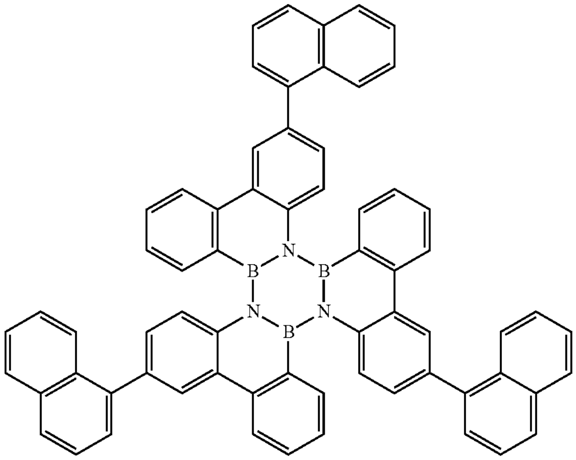
24
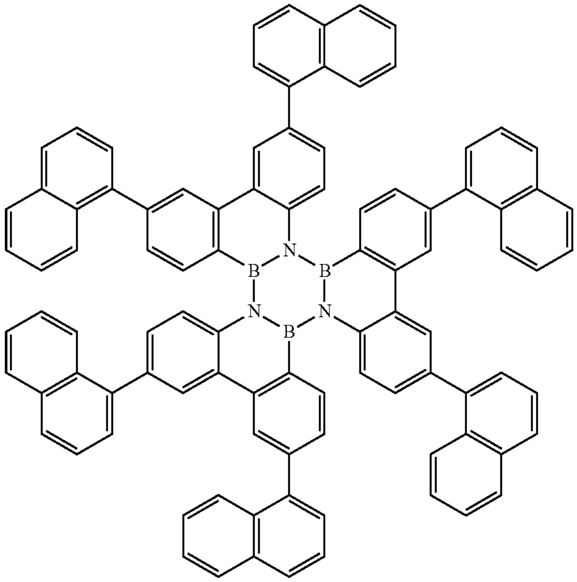
25
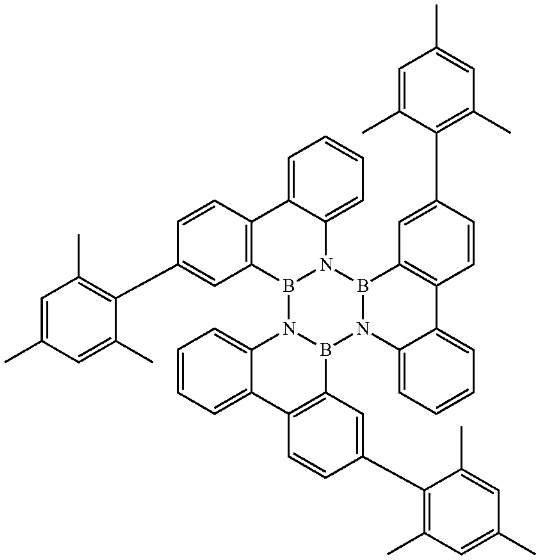

-continued
26
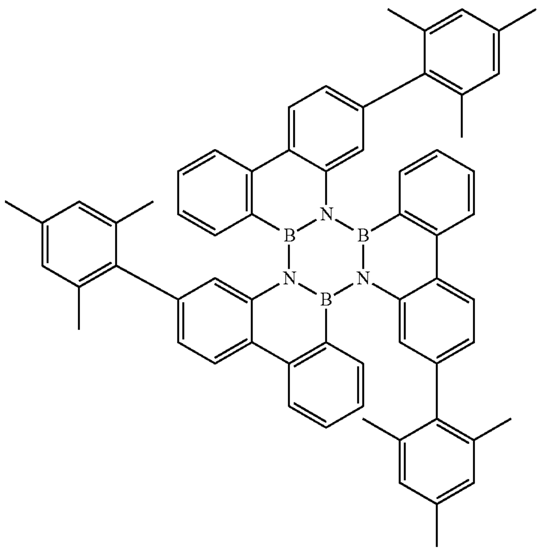
27
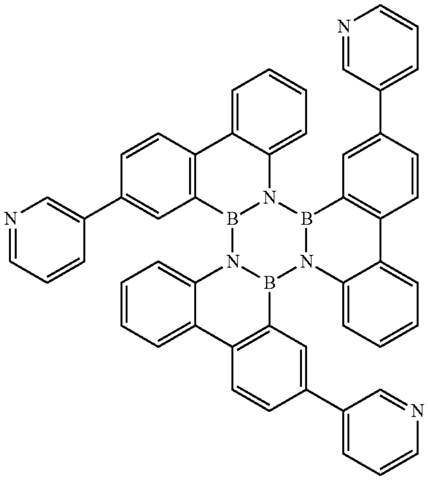
28
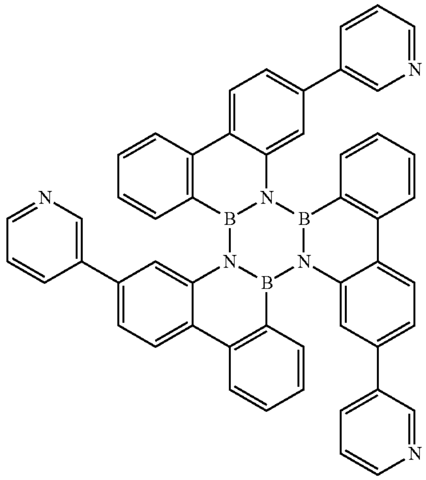
-continued
29
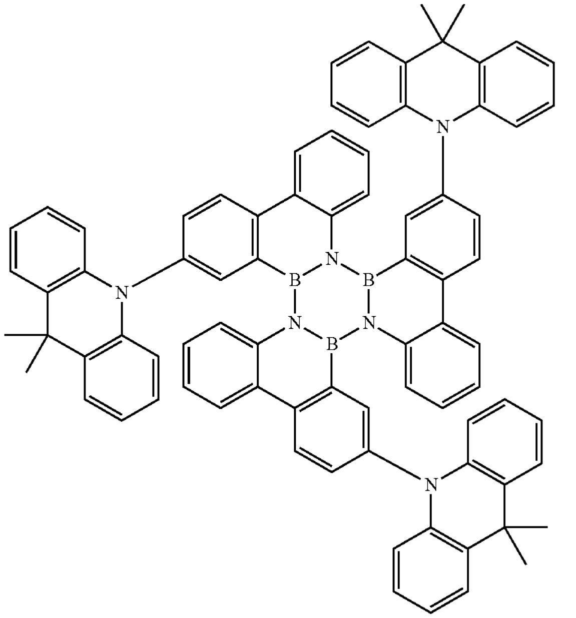
30
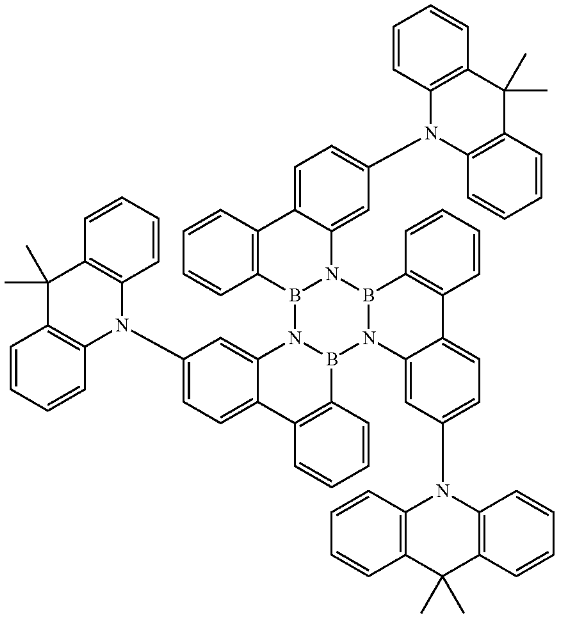

-continued
31
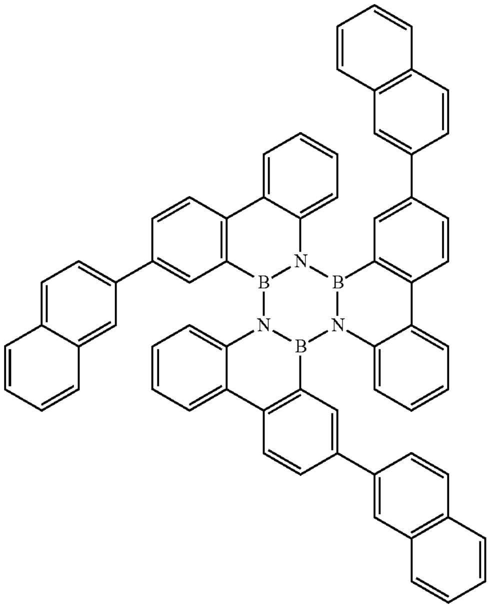
-continued
32
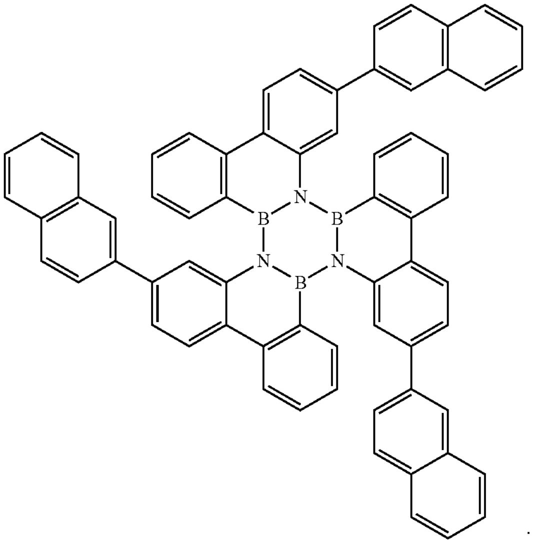
.
* * * * *